United States Patent
Shiokawa et al.

(10) Patent No.: US 11,489,109 B2
(45) Date of Patent: Nov. 1, 2022

(54) MAGNETORESISTIVE EFFECT ELEMENT AND MAGNETIC MEMORY

(71) Applicant: TDK CORPORATION, Tokyo (JP)

(72) Inventors: Yohei Shiokawa, Tokyo (JP); Minoru Ota, Tokyo (JP); Tomoyuki Sasaki, Tokyo (JP); Yoshitomo Tanaka, Tokyo (JP)

(73) Assignee: TDK CORPORATION, Tokyo (JP)

( * ) Notice: Subject to any disclaimer, the term of this patent is extended or adjusted under 35 U.S.C. 154(b) by 204 days.

(21) Appl. No.: 16/952,274

(22) Filed: Nov. 19, 2020

(65) Prior Publication Data

US 2021/0151667 A1 May 20, 2021

Related U.S. Application Data

(63) Continuation-in-part of application No. 16/083,202, filed as application No. PCT/JP2017/038987 on Oct. 27, 2017, now Pat. No. 10,871,528.

(30) Foreign Application Priority Data

Feb. 28, 2017 (JP) .............................. JP2017-037245

(51) Int. Cl.
*H01L 43/10* (2006.01)
*G01R 33/09* (2006.01)
(Continued)

(52) U.S. Cl.
CPC ............ *H01L 43/10* (2013.01); *G01R 33/093* (2013.01); *G11C 11/161* (2013.01);
(Continued)

(58) Field of Classification Search
CPC .. G01R 33/093; G01R 33/098; G11C 11/161; G11C 13/0002; H01L 21/8239;
(Continued)

(56) References Cited

U.S. PATENT DOCUMENTS 5,465,185 A 11/1995 Heim et al.
6,175,476 B1 1/2001 Huai et al.
(Continued)

FOREIGN PATENT DOCUMENTS

JP 2010-021580 A 1/2010
JP 2011-142326 A 7/2011
WO 2016/159017 A1 10/2016

OTHER PUBLICATIONS

S.S.P.Parkin, "Systematic Variation of the Strength and Oscillation Period of Indirect Magnetic Exchange Coupling through the 3d, 4d, and 5d Transition Metals", Physical Review Letters, vol. 67, 1991, p. 3598-p. 3601.

(Continued)

Primary Examiner — Feifei Yeung Lopez
(74) Attorney, Agent, or Firm — Oliff PLC

(57) ABSTRACT

A magnetoresistive effect element includes a magnetization fixed layer, a magnetization free layer, and a non-magnetic spacer layer that is stacked between the magnetization fixed layer and the magnetization free layer. The magnetization free layer includes a first free layer and a second free layer that are formed of a ferromagnetic material, and a magnetic coupling layer that is stacked between the first free layer and the second free layer. The first free layer and the second free layer are magnetically coupled to each other by exchange coupling via the magnetic coupling layer such that magnetization directions of the first free layer and the second free layer are antiparallel to each other. The magnetic coupling layer is a non-magnetic layer that includes Ir and at least one of the following elements: Fe, Co and Ni.

19 Claims, 13 Drawing Sheets

(51) Int. Cl.
- *G11C 11/16* (2006.01)
- *H01L 43/08* (2006.01)
- *H01F 10/32* (2006.01)
- *H01L 27/22* (2006.01)
- *G11C 13/00* (2006.01)

(52) U.S. Cl.
CPC ..... *G11C 13/0002* (2013.01); *H01F 10/3254* (2013.01); *H01L 27/222* (2013.01); *H01L 43/08* (2013.01)

(58) Field of Classification Search
CPC ..... H01L 27/222; H01L 27/226; H01L 43/02; H01L 43/04; H01L 43/06; H01L 43/065; H01L 43/08; H01L 43/10; H01L 41/20; H01L 45/1233; H01F 10/329; H01F 10/3286
See application file for complete search history.

(56) References Cited

U.S. PATENT DOCUMENTS

| | | | |
|---|---|---|---|
| 6,972,992 B1 | 12/2005 | Fukuzumi et al. | |
| 2003/0103299 A1 | 6/2003 | Saito | |
| 2005/0018363 A1 | 1/2005 | Hasegawa et al. | |
| 2007/0086121 A1 | 4/2007 | Nagase et al. | |
| 2008/0113220 A1* | 5/2008 | Sun | H01F 10/3254 428/800 |
| 2008/0253038 A1 | 10/2008 | Nakabayashi et al. | |
| 2010/0118600 A1 | 5/2010 | Nagase et al. | |
| 2012/0008381 A1 | 1/2012 | Nagase et al. | |
| 2012/0069640 A1 | 3/2012 | Nagase et al. | |
| 2013/0299929 A1 | 11/2013 | Watanabe et al. | |
| 2018/0019388 A1 | 1/2018 | Fukami et al. | |
| 2018/0240844 A1 | 8/2018 | Yang et al. | |

OTHER PUBLICATIONS

K.Yakushiji et al. "Very strong antiferromagnetic interlayer exchange coupling with iridium spacer layer for perpendicular magnetic tunnel junctions", Applied Physics Letters, 110, 2017, p. 092406-1-p. 092406-4.

Kay Yakushiji et al. "Ultralow-Voltage Spin-Transfer Switching in Perpendicularly Magnetized Magnetic Tunnel Junctions with Synthetic Antiferromagnetic Reference Layer", Applied Physics Express, 6, 2013, p. 113006.

S.S.P. Parkin et al. "Spin engineering: Direct determination of the Ruderman-Kittel-Kasuya-Yosida far-field range function in ruthenium", Phys. Rev. B, vol. 44, 1991, p. 7131-p. 7134.

Aug. 13, 2019 Office Action issued in U.S. Appl. No. 16/083,202.
Sep. 12, 2019 International Preliminary Report on Patentability issued in International Patent Application No. PCT/JP2017/038987.
Sep. 12, 2019 International Preliminary Report on Patentability issued in International Patent Application No. PCT/JP2018/007300.
Jan. 2, 2020 Office Action issued in U.S. Appl. No. 16/083,202.
Apr. 29, 2020 Office Action issued in U.S. Appl. No. 16/083,202.
Aug. 19, 2020 U.S. Notice of Allowance issued U.S. Appl. No. 16/083,202.

* cited by examiner (A)

(B)

(A)

(B)

(A)

(B)

(A)

(B)

MAGNETORESISTIVE EFFECT ELEMENT AND MAGNETIC MEMORY

This application is a Continuation-in-Part of application Ser. No. 16/083,202, filed Sep. 7, 2018, which is a national stage of PCT/JP2017/038987, filed Oct. 27, 2017, which claims priority to Japanese Patent Application No. 2017-037245, filed Feb. 28, 2017. The disclosure of the prior applications is hereby incorporated by reference herein in their entirety.

TECHNICAL FIELD

The present disclosure relates to a magnetoresistive effect element and a magnetic memory.

BACKGROUND ART

Magnetoresistive effect elements such as a giant magnetoresistive effect (GMR) element and a tunnel magnetoresistive effect (TMR) element having a configuration in which a reference layer as a magnetization fixed layer, a non-magnetic spacer layer, and a recording layer as a magnetization free layer are stacked in this order are known. Among the magnetoresistive effect elements, the TMR element that uses an insulation layer (tunnel barrier layer) as the non-magnetic spacer layer generally has high element resistance but can realize a high MR ratio, compared to the GMR element that uses a conductive layer as the non-magnetic spacer layer. Thus, the TMR element has drawn attention as an element used in a magnetic sensor, a magnetic head, a magnetoresistive random access memory (MRAM), and the like.

A technology called "spin injection magnetization reversal" in which a spin transfer torque (STT) is applied to the magnetization free layer from electron spins by causing a spin-polarized current to flow through the magnetization free layer is known as a method of reversing the magnetization direction of the magnetization free layer of the TMR element. For example, applying this technology to the MRAM can reduce the size of a memory cell and thus can achieve high density for the reason that an interconnect for magnetic field generation for reversing the magnetization direction of the magnetization free layer is not necessary. Generally, the MRAM that uses the magnetization reversal technology based on the STT is called an "STT-MRAM".

In addition, the use of a perpendicular magnetization type TMR element that has perpendicular magnetic anisotropy is considered in order to further achieve high density in the MRAM or the like (for example, Non-Patent Literatures 1 and 2 below). In such a TMR element, the magnetization direction of the reference layer is fixed along a perpendicular direction (the stack direction of the element; that is, a direction orthogonal to the in-plane direction of each layer), and the easy magnetization axis of the magnetization free layer is also along the perpendicular direction. Accordingly, since the amount of current needed for spin injection magnetization reversal can be reduced, the size of a selection transistor for selecting the TMR element can be reduced. Consequently, in the case of using the TMR element having perpendicular magnetic anisotropy, high density can be achieved since the size of the memory cell can be reduced compared to that in the case of using the TMR element that has in-plane magnetic anisotropy.

In addition, the magnetization direction of the magnetization fixed layer in the magnetoresistive effect element is fixed such that the magnetization direction does not substantially change at the time of using the element. However, when the magnetization direction of the magnetization fixed layer is not sufficiently fixed due to any cause, and a deviation from a predetermined direction occurs, problems such as a decrease in long-term stability at the time of using the element, a decrease in magnetoresistive effect ratio (MR ratio), and a decrease in the symmetry of an output signal with respect to an external magnetic field are posed. For example, in the case of the MRAM in which the TMR element is used, a problem such as the inability to stably hold magnetic recording information for a long term is posed.

A ferromagnetic multilayer film called a synthesized anti-ferromagnetic structure (hereinafter, referred to as an "SAF structure") is known as a technology for strongly fixing the magnetization direction of the magnetization fixed layer (for example, Patent Literature 1 below). The SAF structure is configured with a first fixed layer, a second fixed layer, and a magnetic coupling layer. The first fixed layer and the second fixed layer are formed of a ferromagnetic material. The magnetic coupling layer is formed of a non-magnetic material and is interposed between the first fixed layer and the second fixed layer. The first fixed layer and the second fixed layer are antiferromagnetically coupled to each other by an exchange coupling magnetic field via the magnetic coupling layer. Thus, magnetic flux occurring from the first fixed layer and magnetic flux occurring from the second fixed layer are distributed such that the magnetic flux as a whole forms a circulating path. Accordingly, since the magnetization directions of the first fixed layer and the second fixed layer are not easily changed by an external magnetic field, a spin torque, or the like, the magnetization direction can be strongly fixed.

CITATION LIST

Patent Literature

[Patent Literature 1] U.S. Pat. No. 5,465,185

Non Patent Literature

[Non-Patent Literature 1] S. S. P. Parkin, "Systematic Variation of the Strength and Oscillation Period of Indirect Magnetic Exchange Coupling through the 3d, 4d, and 5d Transition Metals", Physical Review Letters, Vol. 67, p. 3598-3601 (1991)

[Non-Patent Literature 2] K. Yakushiji, A. Sugihara, A. Fukushima, H. Kubota, S. Yuasa, "Very strong antiferromagnetic interlayer exchange coupling with iridium spacer layer for perpendicular magnetic tunnel junctions", Applied Physics Letters, 110, 092406 (2017)

SUMMARY

While Ru has been mainly used thus far as a material that constitutes the magnetic coupling layer of the SAF structure, Ir has recently drawn attention as a material that may generate a stronger exchange coupling magnetic field. However, when Ir is used in the magnetic coupling layer in the SAF structure of the perpendicular magnetization type magnetoresistive effect element, the fixing of the magnetization direction of the magnetization fixed layer along the perpendicular direction is easily weakened. For example, as disclosed in FIG. 3(a) in Non-Patent Literature 2 above, the value of the squareness ratio (the value of Mr/Ms which is the ratio of residual magnetization (Mr) to saturation magnetization (Ms)) is significantly lower than an ideal value of one in an M-H loop that is measured by applying a magnetic field along the perpendicular direction of the magnetoresistive effect element. The cause is considered to be that the fixing of the magnetization directions of the first fixed layer and the second fixed layer in the SAF structure of the magnetoresistive effect element in the perpendicular direction is weakened.

The present disclosure is conceived in view of the above problems. An object of the present disclosure is to provide a magnetoresistive effect element that has an SAF structure including a magnetic coupling layer including Ir and fixes the magnetization directions of a first fixed layer and a second fixed layer of the SAF structure more strongly than in the related art, and a magnetic memory in which such a magnetoresistive effect element is used.

In order to resolve the above problem, a magnetoresistive effect element according to one aspect of the present disclosure includes a magnetization fixed layer, a magnetization free layer, and a non-magnetic spacer layer that is stacked between the magnetization fixed layer and the magnetization free layer. The magnetization fixed layer includes a first fixed layer and a second fixed layer that are formed of a ferromagnetic material, and a magnetic coupling layer that is stacked between the first fixed layer and the second fixed layer. The first fixed layer and the second fixed layer are magnetically coupled to each other by exchange coupling via the magnetic coupling layer such that magnetization directions of the first fixed layer and the second fixed layer are antiparallel to each other. The magnetic coupling layer is a non-magnetic layer that includes Ir and at least one of the following elements: Cr, Mn, Fe, Co, and Ni.

The inventor of the present application has found that in an SAF structure in which the magnetic coupling layer formed of Ir is used, the fixing of the magnetization directions of the first fixed layer and the second fixed layer is weakened due to lattice mismatch between the magnetic coupling layer and the first fixed layer and the second fixed layer. Specifically, for example, the first fixed layer and the second fixed layer have a hexagonal close-packed structure (hcp structure) and uniaxial anisotropy energy Ku in a perpendicular direction that is a c-axis direction. However, the first fixed layer and the second fixed layer are distorted by the magnetic coupling layer such that an a-axis (and a b-axis) is lengthened, and a c-axis is shortened (a crystal axial ratio c/a is decreased) by lattice mismatch with respect to the magnetic coupling layer. Thus, the value of uniaxial anisotropy energy Ku may be decreased or become a negative value.

Accordingly, since the magnetization directions of the first fixed layer and the second fixed layer become easier to be directed in the stack plane, the fixing of the magnetization directions of the first fixed layer and the second fixed layer along the perpendicular direction is weakened.

Meanwhile, in the magnetoresistive effect element according to one aspect of the present disclosure, the magnetic coupling layer includes at least one of Cr, Mn, Fe, Co and Ni in addition to Ir such that a lattice mismatch ratio with respect to the first fixed layer and the second fixed layer is decreased, compared to that in a case where the magnetic coupling layer is assumed to be formed of only Ir. Accordingly, since the distortion of the first fixed layer and the second fixed layer by the magnetic coupling layer such that the crystal axial ratio c/a is decreased can be reduced, the negative uniaxial anisotropy energy Ku of the first fixed layer and the second fixed layer can be reduced (that is, the value of the uniaxial anisotropy energy Ku can be increased or increased to the positive side). Consequently, since the magnetization directions of the first fixed layer and the second fixed layer become easier to be directed in the perpendicular direction, the fixing of the magnetization directions of the first fixed layer and the second fixed layer along the perpendicular direction can be strengthened.

Furthermore, in the magnetoresistive effect element according to one aspect of the present disclosure, an absolute value of a lattice mismatch ratio between the magnetic coupling layer and the first fixed layer or the second fixed layer may be less than or equal to 7%. In this case, the value of the uniaxial anisotropy energy Ku of the first fixed layer and the second fixed layer can be sufficiently increased, compared to that in a case where the magnetic coupling layer is assumed to be formed of only Ir. Thus, the fixing of the magnetization directions of the first fixed layer and the second fixed layer along the perpendicular direction is particularly strengthened.

Furthermore, in the magnetoresistive effect element according to one aspect of the present disclosure, the magnetic coupling layer may have an fcc structure or an hcp structure. Each of the first fixed layer and the second fixed layer may include Co, Ni, or an alloy of Co or Ni, and have the fcc structure or the hcp structure.

Furthermore, in the magnetoresistive effect element according to one aspect of the present disclosure, the magnetization fixed layer may further include a first interposed layer and a second interposed layer that are stacked between the first fixed layer and the magnetic coupling layer. The first interposed layer may be in contact with the first fixed layer, and the second interposed layer may be in contact with the first fixed layer and the magnetic coupling layer. A main element of the magnetic coupling layer and the first interposed layer may be Ir. A main element of the second interposed layer may be a element other than Ir. A thickness of the first interposed layer may be greater than or equal to 1.5 times and less than or equal to 3.2 times an atomic radius of Ir. A thickness of the second interposed layer may be less than or equal to 1.5 times an atomic radius of the main element of the second interposed layer.

Accordingly, the diffusion of the element constituting the first fixed layer to the magnetic coupling layer, and the diffusion of the element constituting the magnetic coupling layer to the first fixed layer are suppressed by the presence of the second interposed layer. If such diffusion occurs, the abruptness of the interface between the first fixed layer and the magnetic coupling layer is decreased. Thus, since the abruptness of the interface between the first fixed layer and the magnetic coupling layer is maintained by the above configuration, a decrease in exchange coupling magnetic field between the first fixed layer and the second fixed layer via the magnetic coupling layer in the SAF structure can be suppressed. In addition, the thicknesses and the arrangement of the first interposed layer and the second interposed layer are determined such that those layers do not substantially affect or sufficiently slightly affect the exchange coupling between the first fixed layer and the second fixed layer. Thus, since the antiferromagnetic exchange coupling magnetic field between the first fixed layer and the second fixed layer can be maintained to be strong, the fixing of the magnetization directions of the first fixed layer and the second fixed layer along the perpendicular direction is particularly strengthened.

Furthermore, in the magnetoresistive effect element according to one aspect of the present disclosure, a thickness of the magnetic coupling layer may be less than or equal to 1 nm. In this case, an antiferromagnetic exchange coupling magnetic field between the first fixed layer and the second fixed layer via the magnetic coupling layer can be particularly strengthened. Thus, the fixing of the magnetization directions of the first fixed layer and the second fixed layer along the perpendicular direction is particularly strengthened.

Furthermore, in the magnetoresistive effect element according to one aspect of the present disclosure, the magnetic coupling layer may include a first non-magnetic layer and a second non-magnetic layer that include Ir and at least one of the following elements: Cr, Mn, Fe, Co, and Ni, and an intermediate non-magnetic layer that is formed of Ir or Ru and is stacked between the first non-magnetic layer and the second non-magnetic layer. Accordingly, the value of the uniaxial anisotropy energy Ku of the first fixed layer and the second fixed layer can be increased by the first non-magnetic layer and the second non-magnetic layer based on the above principle. Furthermore, since the intermediate non-magnetic layer that is formed of Ir or Ru and does not substantially include other elements is included in the magnetic coupling layer between the first non-magnetic layer and the second non-magnetic layer, the exchange coupling magnetic field in the SAF structure can be particularly strengthened. Consequently, the fixing of the magnetization directions of the first fixed layer and the second fixed layer along the perpendicular direction is particularly strengthened.

Furthermore, in the magnetoresistive effect element according to one aspect of the present disclosure, at least one of the first fixed layer and the second fixed layer may have a stack structure represented by [Co/Pt]n, [Co/Pd]n, or [Co/Ni]n. Since in these stack structures, the uniaxial anisotropy energy Ku in the perpendicular direction can be particularly increased, the fixing of the magnetization directions of the first fixed layer and the second fixed layer along the perpendicular direction is particularly strengthened.

Furthermore, in the magnetoresistive effect element according to one aspect of the present disclosure, the magnetization free layer may include a first free layer and a second free layer that are formed of a ferromagnetic material, and a magnetic coupling layer that is formed of a non-magnetic material and is stacked between the first free layer and the second free layer. The first free layer and the second free layer may be magnetically coupled to each other by exchange coupling via the magnetic coupling layer such that magnetization directions of the first free layer and the second free layer are antiparallel to each other. Accordingly, since the magnetization direction of the magnetization free layer as a whole is resistant to thermal agitation, the magnetoresistive effect element has high thermal stability.

Furthermore, the magnetoresistive effect element according to one aspect of the present disclosure may further include a spin orbit torque interconnect layer that is disposed such that a spin orbit torque is applied to the magnetization free layer. Accordingly, the magnetization direction of the magnetization free layer can be reversed using the spin orbit torque.

In addition, a magnetic memory according to one aspect of the present disclosure includes any of the magnetoresistive effect elements as a storage element.

According to the present disclosure, a magnetoresistive effect element that has an SAF structure including a magnetic coupling layer including Ir and fixes the magnetization directions of a first fixed layer and a second fixed layer of the SAF structure more strongly than in the related art, and a magnetic memory in which such a magnetoresistive effect element is used are provided.

DESCRIPTION OF EMBODIMENTS

Figure 1:
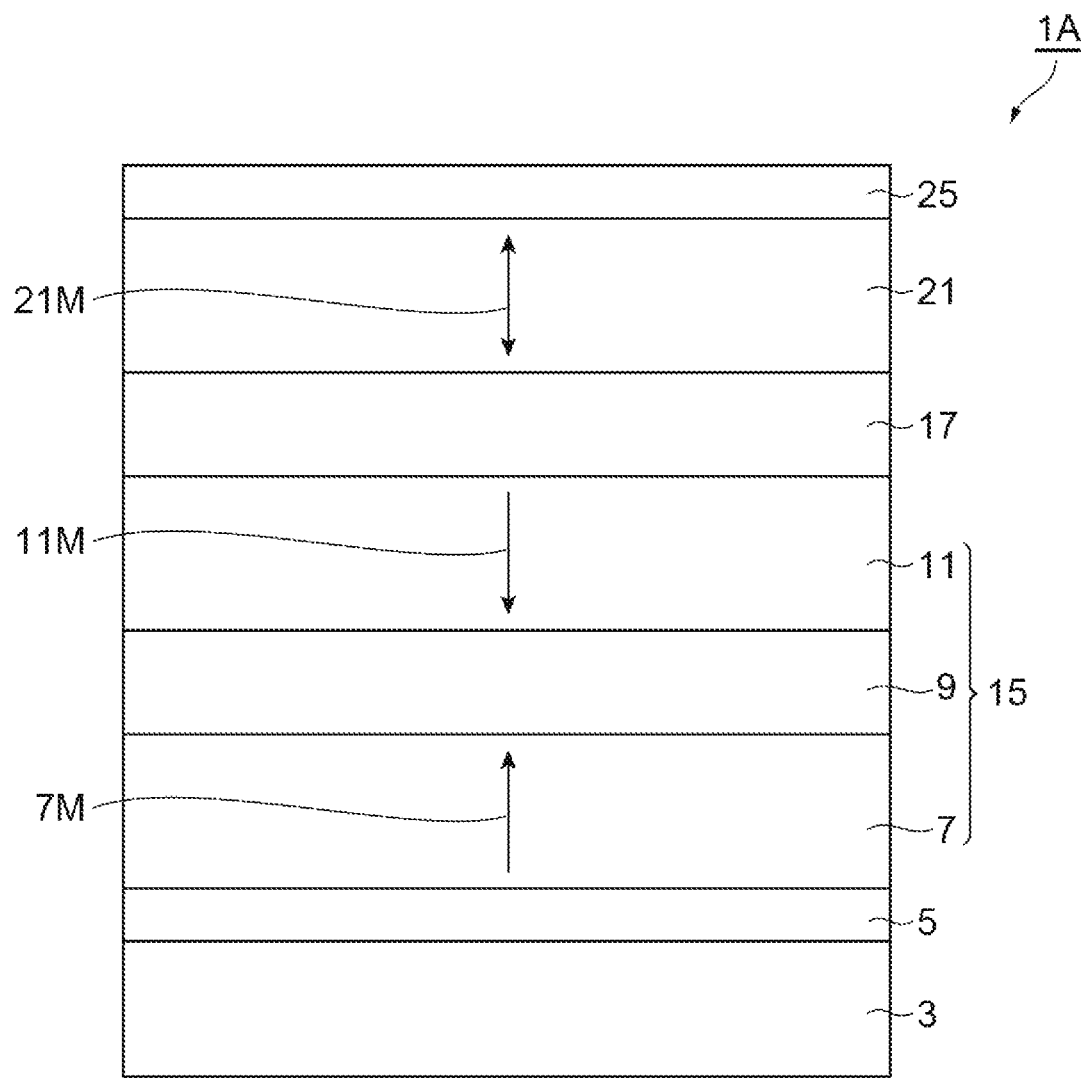
FIG. 1 is a view illustrating a cross-section of a magnetoresistive effect element according to a first embodiment.

Hereinafter, embodiments of the present disclosure will be described in detail with reference to the appended drawings. In each drawing, the same reference signs are used for the same elements if possible. In addition, the ratio of dimensions in constituents and among constituents in the drawings is arbitrarily set for easy understanding of the drawings.

First Embodiment

FIG. 1 is a view illustrating a cross-section of a magnetoresistive effect element according to a first embodiment. A magnetoresistive effect element 1A of the present embodiment is a perpendicular magnetization type magnetoresistive effect element and includes a substrate 3, a base layer 5, a magnetization fixed layer 15, a non-magnetic spacer layer 17, a magnetization free layer 21, and a cap layer 25. Depending on the application of the magnetoresistive effect element 1A, the magnetization fixed layer 15 is also called a reference layer, and the magnetization free layer 21 is also called a recording layer.

The substrate 3 is formed of, for example, a monocrystalline metal oxide, monocrystalline silicon, monocrystalline silicon with a thermal oxide film, monocrystalline sapphire, ceramic, quartz, or glass. A material included in the substrate 3 is not particularly limited, provided that the material has appropriate mechanical strength and is appropriate for heat treatment or micromachining. The monocrystalline metal oxide is exemplified by, for example, monocrystalline MgO. In the substrate that includes monocrystalline MgO, an epitaxial growth film is easily formed on the substrate.

The base layer 5 is stacked on the principal surface of the substrate 3 and functions as a lower electrode for causing a detection current or the like to flow. The base layer 5 is formed of, for example, at least one metal of Ag, Au, Cu, Cr, V, Al, W, or Pt. The base layer 5 may include an alloy of these metals, or a stack body of materials of two or more kinds of these metals.

The magnetoresistive effect element 1A may further include a crystal orientation layer that is stacked on the base layer 5. The crystal orientation layer is a layer for controlling the crystal orientation of an upper layer and includes, for example, at least one of MgO, TiN and a NiTa alloy.

The magnetization fixed layer 15 is stacked on the base layer 5 and includes a first fixed layer 7, a second fixed layer 11, and a magnetic coupling layer 9 that is stacked between the first fixed layer 7 and the second fixed layer 11. Each of the first fixed layer 7 and the second fixed layer 11 is formed of a ferromagnetic material such as Co, Ni, or an alloy of Co and Ni, and has, for example, a face-centered cubic structure (fcc structure) or a hexagonal close-packed structure (hcp structure). The thickness of each of the first fixed layer 7 and the second fixed layer 11 can be, for example, greater than or equal to 1 nm and less than or equal to 20.0 nm.

The magnetic coupling layer 9 is a non-magnetic layer that is formed of a conductive material and, specifically, includes Ir and at least one of the following five kinds of elements: Cr, Mn, Fe, Co and Ni. The form in which the magnetic coupling layer 9 includes at least one of Cr, Mn, Fe, Co and Ni is not particularly limited. For example, at least one of Cr, Mn, Fe, Co and Ni can be included in the magnetic coupling layer 9 in the form of an alloy with Ir, the form of a compound with Ir, the form of a substitutional defect in a crystal formed of Ir or an Ir compound, or the form of an additive for a crystal formed of Ir or an Ir compound. The magnetic coupling layer 9 preferably includes Ir as a main element. The main element of the magnetic coupling layer 9 means an element of which the atomic ratio is the highest among elements constituting the magnetic coupling layer 9. In the following description, the same applies to the main element of other layers. In addition, the magnetic coupling layer 9 has, for example, the fcc structure or the hcp structure. The thickness of the magnetic coupling layer 9 can be, for example, greater than or equal to 0.3 nm and less than or equal to 2.0 nm.

The magnetization fixed layer 15 has an SAF structure. That is, the first fixed layer 7 and the second fixed layer 11 are magnetically coupled to each other by exchange coupling via the magnetic coupling layer 9 such that a magnetization direction 7M of the first fixed layer 7 and a magnetization direction 11M of the second fixed layer 11 are antiparallel to each other. Each of the magnetization direction 7M and the magnetization direction 11M is fixed along a perpendicular direction.

The non-magnetic spacer layer 17 is stacked between the magnetization fixed layer 15 and the magnetization free layer 21. For example, when the non-magnetic spacer layer 17 is formed of a metal material such as Cu, Ag, Al, NiAl, Si, or Ge, or a conductive non-magnetic material such as a non-magnetic Heusler alloy, the magnetoresistive effect element 1A is a GMR effect element. In this case, the thickness of the non-magnetic spacer layer 17 can be, for example, greater than or equal to 2.0 nm and less than or equal to 5.0 nm. For example, when the non-magnetic spacer layer 17 is formed of an oxide material such as MgO or $MgAl_2O_4$, or a non-magnetic material having insulation properties such as a non-magnetic spinel material, the magnetoresistive effect element 1A is a TMR effect element. In this case, the thickness of the non-magnetic spacer layer 17 can be, for example, greater than or equal to 0.8 nm and less than or equal to 4.0 nm.

The magnetization free layer 21 is formed of a ferromagnetic material such as Fe, Co—Fe, Co—Fe—B, or a ferromagnetic Heusler alloy. The thickness of the magnetization free layer 21 can be, for example, greater than or equal to 0.5 nm and less than or equal to 2.0 nm. While a magnetization direction 21M of the magnetization free layer 21 is not substantially fixed, the magnetization free layer 21 has an easy magnetization axis along the perpendicular direction. Thus, the magnetization direction 21M can be easily reversed from the upward perpendicular direction to the downward perpendicular direction or in the opposite direction by applying an external magnetic field of a measurement target, a spin torque, or the like to the magnetization free layer 21. By doing so, the relative angle between the magnetization direction 11M of the second fixed layer 11 and the magnetization direction 21M of the magnetization free layer 21 is changed, and thus the electrical resistance value of the magnetoresistive effect element 1A in the perpendicular direction is changed such that a magnetoresistive effect is exhibited.

The cap layer 25 is disposed in order to protect each layer of the magnetoresistive effect element 1A. The cap layer 25 is formed of, for example, one or more metal elements of Ru, Ag, Al, Cu, Au, Cr, Mo, Pt, W, Ta, Pd, and Ir, an alloy of these metal elements, or a stack body of materials of two or more kinds of these metal elements.

As in the related art, in the SAF structure in which the magnetic coupling layer formed of Ir is used, the first fixed layer and the second fixed layer are distorted by the magnetic coupling layer such that a crystal axial ratio c/a is decreased by lattice mismatch with respect to the magnetic coupling layer. Thus, the value of uniaxial anisotropy energy Ku in the perpendicular direction of the first fixed layer and the second fixed layer may be decreased or become a negative value. Accordingly, since the magnetization directions of the first fixed layer and the second fixed layer become easier to be directed in the stack plane, the fixing of the magnetization directions of the first fixed layer and the second fixed layer along the perpendicular direction is weakened.

Meanwhile, in the aforementioned magnetoresistive effect element 1A according to the present embodiment, the magnetic coupling layer 9 includes at least one of Cr, Mn, Fe, Co and Ni in addition to Ir such that the lattice mismatch ratio with respect to the first fixed layer 7 and the second fixed layer 11 is decreased, compared to that in a case where the magnetic coupling layer 9 is assumed to be formed of only Ir. For example, when the atomic spacing in the lattice matching plane of each of the first fixed layer 7 and the second fixed layer 11 is smaller than the atomic spacing in the lattice matching plane of the magnetic coupling layer 9 in a case where the magnetic coupling layer 9 is assumed to be formed of only Ir, the magnetic coupling layer 9 includes at least one of Cr, Mn, Fe, Co and Ni such that the atomic spacing of the magnetic coupling layer 9 is decreased.

Accordingly, since the distortion of the first fixed layer 7 and the second fixed layer 11 by the magnetic coupling layer 9 such that the crystal axial ratio c/a is decreased can be reduced, the negative uniaxial anisotropy energy Ku of the first fixed layer 7 and the magnetic coupling layer 9 can be reduced (that is, the value of the uniaxial anisotropy energy Ku can be increased to the positive side). Thus, since the magnetization direction 7M of the first fixed layer 7 and the magnetization direction 11M of the second fixed layer 11 become easier to be directed in the perpendicular direction, the fixing of the magnetization direction 7M of the first fixed layer 7 and the magnetization direction 11M of the second fixed layer 11 along the perpendicular direction can be strengthened. The lattice mismatch ratio between the magnetic coupling layer 9 and the first fixed layer 7 or the second fixed layer 11 is defined by Expression $(D_{FM}-D_{NM})/D_{NM} \times 100$ when the atomic spacing in the lattice matching plane of the magnetic coupling layer 9 is denoted by $D_{NM}$, and the atomic spacing in the lattice matching plane of the first fixed layer 7 or the second fixed layer 11 is denoted by $D_{FM}$.

In the aforementioned magnetoresistive effect element 1A according to the present embodiment, the absolute value of the lattice mismatch ratio between the magnetic coupling layer 9 and the first fixed layer 7 or the second fixed layer 11 is preferably less than or equal to 7%. In this case, the value of the uniaxial anisotropy energy Ku in the perpendicular direction of the first fixed layer 7 and the second fixed layer 11 can be sufficiently increased to the positive side, compared to that in a case where the magnetic coupling layer 9 is assumed to be formed of only Ir. Thus, the fixing of the magnetization direction 7M of the first fixed layer 7 and the magnetization direction 11M of the second fixed layer 11 along the perpendicular direction is particularly strengthened.

In addition, in the aforementioned magnetoresistive effect element 1A according to the present embodiment, the thickness of the magnetic coupling layer 9 is preferably less than or equal to 1 nm. In this case, an antiferromagnetic exchange coupling magnetic field between the first fixed layer 7 and the second fixed layer 11 via the magnetic coupling layer 9 can be particularly strengthened. Thus, the fixing of the magnetization direction 7M of the first fixed layer 7 and the magnetization direction 11M of the second fixed layer 11 along the perpendicular direction is particularly strengthened.

In addition, in the aforementioned magnetoresistive effect element 1A according to the present embodiment, at least one of the first fixed layer 7 and the second fixed layer 11 preferably has a stack structure represented by [Co/Pt]n, [Co/Pd]n, or [Co/Ni]n. Since in these stack structures, the uniaxial anisotropy energy Ku in the perpendicular direction can be particularly increased, the fixing of the magnetization direction 7M of the first fixed layer 7 and the magnetization direction 11M of the second fixed layer 11 along the perpendicular direction is particularly strengthened. The stack structures [Co/Pt]n, [Co/Pd]n, and [Co/Ni]n respectively mean a structure in which n Co layers and n Pt layers are alternately stacked, a structure in which n Co layers and n Pd layers are alternately stacked, and a structure in which n Co layers and n Ni layers are alternately stacked, and n is, for example, an integer greater than or equal to 2 and less than or equal to 10. In this case, the thickness of each Co layer, each Pt layer, each Pd layer, and each Ni layer can be, for example, greater than or equal to 0.2 nm and less than or equal to 2.0 nm.

Next, a change in lattice mismatch ratio with respect to the first fixed layer 7 and the second fixed layer 11 caused by including any of Cr, Mn, Fe, Co, and Ni to Ir of the magnetic coupling layer 9 will be described based on a combination of specific material examples.

Table 1 shows the material of the magnetic coupling layer, the material of the first (second) fixed layer, and the lattice mismatch ratio between the magnetic coupling layer and the first (second) fixed layer in Comparative Example 1 to Comparative Example 6 and Example 1 to Example 5. The magnetic coupling layer in Comparative Example 1 is formed of Ir. The magnetic coupling layers in Example 1 to Example 5 are formed of materials that respectively include Cr, Mn, Fe, Co, and Ni to Ir at a ratio shown in Table 1, and the magnetic coupling layers in Comparative Examples 2 to 6 are formed of materials that respectively include Ta, Ta, W, Mo, and Pt to Ir at a ratio shown in Table 1. The first (second) fixed layer in all of the comparative examples and the examples is formed of Co. The magnetic coupling layer in the comparative examples and the examples has the fcc structure in which the plane (111) is regarded as the lattice matching plane with respect to the first (second) fixed layer.

Thus, the value of the atomic spacing $D_{NM}$ in the plane (111) of the magnetic coupling layer is acquired by dividing the length of the a-axis of the magnetic coupling layer by the square root of two. In addition, the first (second) fixed layer in the comparative examples and the examples has the hcp structure in which the plane (0001) is regarded as the lattice matching plane with respect to the magnetic coupling layer. Thus, the atomic spacing $D_{FM}$ in the plane (0001) of the first (second) fixed layer is equal to the lattice constant of the a-axis of the magnetic coupling layer. The lattice mismatch was calculated by Formula: lattice mismatch (%)=$(D_{FM}-D_{NM})/D_{NM} \times 100$.

As shown in Table 1, when the lattice mismatch ratios are compared between Comparative Example 1 and Examples 1 to 5, it is understood that the absolute value of the lattice mismatch ratio between the magnetic coupling layer and the first (second) fixed layer formed of Co is decreased by including Cr, Mn, Fe, Co, or Ni to Ir of the magnetic coupling layer. In addition, when the lattice mismatch ratios are compared between Comparative Example 1 and Comparative Examples 2 to 6, it is understood that the absolute value of the lattice mismatch ratio between the magnetic coupling layer and the first (second) fixed layer formed of Co is increased by including Ta, W, Mo, or Pt to Ir of the magnetic coupling layer.

TABLE 1

| | Magnetic Coupling Layer | First (Second) Fixed Layer | Lattice Mismatch Ratio (%) |
|---|---|---|---|
| Comparative Example 1 | Ir | Co | −7.54 |
| Example 1 | $Ir_{0.8}Cr_{0.2}$ | Co | −6.59 |
| Example 2 | $Ir_{0.6}Mn_{0.4}$ | Co | −6.86 |
| Example 3 | $Ir_{0.5}Fe_{0.5}$ | Co | −5.74 |
| Example 4 | $Ir_{0.5}Co_{0.5}$ | Co | −4.06 |
| Example 5 | $Ir_{0.5}Ni_{0.5}$ | Co | −4.19 |
| Comparative Example 2 | $Ir_{0.9}Ta_{0.1}$ | Co | −7.97 |
| Comparative Example 3 | $Ir_3Ta_1$ | Co | −8.65 |
| Comparative Example 4 | $Ir_{0.8}W_{0.2}$ | Co | −7.63 |
| Comparative Example 5 | $Ir_{0.85}Mo_{0.15}$ | Co | −7.93 |
| Comparative Example 6 | $Ir_{0.5}Pt_{0.5}$ | Co | −8.44 |

TABLE 2

| | Magnetic Coupling Layer | First (Second) Fixed Layer | Lattice Mismatch Ratio (%) |
|---|---|---|---|
| Comparative Example 7 | Ir | Ni | −8.60 |
| Example 6 | $Ir_{0.8}Cr_{0.2}$ | Ni | −7.66 |
| Example 7 | $Ir_{0.6}Mn_{0.4}$ | Ni | −7.92 |
| Example 8 | $Ir_{0.5}Fe_{0.5}$ | Ni | −6.82 |
| Example 9 | $Ir_{0.5}Co_{0.5}$ | Ni | −5.16 |
| Example 10 | $Ir_{0.5}Ni_{0.5}$ | Ni | −5.29 |
| Comparative Example 8 | $Ir_{0.9}Ta_{0.1}$ | Ni | −9.02 |
| Comparative Example 9 | $Ir_3Ta_1$ | Ni | −9.70 |
| Comparative Example 10 | $Ir_{0.8}W_{0.2}$ | Ni | −8.69 |
| Comparative Example 11 | $Ir_{0.85}Mo_{0.15}$ | Ni | −8.99 |
| Comparative Example 12 | $Ir_{0.5}Pt_{0.5}$ | Ni | −9.49 |

Table 2 shows the material of the magnetic coupling layer, the material of the first (second) fixed layer, and the lattice mismatch ratio between the magnetic coupling layer and the first (second) fixed layer in Comparative Example 7 to Comparative Example 12 and Example 6 to Example 10. The magnetic coupling layer in Comparative Example 7 to Comparative Example 12 and Example 6 to Example 10 is formed of the same material as the magnetic coupling layer in Comparative Example 1 to Comparative Example 6 and Example 1 to Example 5 shown in Table 1, respectively. Thus, the atomic spacing $D_{NM}$ in the lattice matching plane between the magnetic coupling layer and the first (second) fixed layer in Comparative Example 7 to Comparative Example 12 and Example 6 to Example 10 is the same as $D_{NM}$ in Comparative Example 1 to Comparative Example 6 and Example 1 to Example 5 shown in Table 1, respectively. The first (second) fixed layer in all of Comparative Example 7 to Comparative Example 12 and Example 6 to Example 10 is formed of Ni. The first (second) fixed layer in Comparative Example 7 to Comparative Example 12 and Example 6 to Example 10 has the fcc structure in which the plane (111) is regarded as the lattice matching plane with respect to the magnetic coupling layer.

Thus, the value of the atomic spacing $D_{FM}$ in the plane (111) of the first (second) fixed layer is acquired by dividing the length of the a-axis of the magnetic coupling layer by the square root of two. The lattice mismatch is calculated by Formula: lattice mismatch (%)=$(D_{FM}-D_{NM})/D_{NM}\times100$.

As shown in Table 2, when the lattice mismatch ratios are compared between Comparative Example 7 and Examples 6 to 10, it is understood that the absolute value of the lattice mismatch ratio between the magnetic coupling layer and the first (second) fixed layer formed of Ni is decreased by including Cr, Mn, Fe, Co, or Ni to Ir of the magnetic coupling layer. In addition, when the lattice mismatch ratios are compared between Comparative Example 7 and Comparative Examples 8 to 12, it is understood that the absolute value of the lattice mismatch ratio between the magnetic coupling layer and the first (second) fixed layer formed of Ni is increased by including Ta, W, Mo, or Pt to Ir of the magnetic coupling layer.

Table 3 shows the material of the magnetic coupling layer, the material of the first (second) fixed layer, and the lattice mismatch ratio between the magnetic coupling layer and the first (second) fixed layer in Comparative Example 13 to Comparative Example 18 and Example 11 to Example 15. The magnetic coupling layer in Comparative Example 13 to Comparative Example 18 and Example 11 to Example 15 is formed of the same material as the magnetic coupling layer in Comparative Example 1 to Comparative Example 6 and Example 1 to Example 5 shown in Table 1, respectively. Thus, the atomic spacing $D_{NM}$ in the lattice matching plane between the magnetic coupling layer and the first (second) fixed layer in Comparative Example 13 to Comparative Example 18 and Example 11 to Example 15 is the same as $D_{NM}$ in Comparative Example 1 to Comparative Example 6 and Example 1 to Example 5 shown in Table 1, respectively. The first (second) fixed layer in all of Comparative Example 13 to Comparative Example 18 and Example 11 to Example 15 is formed of $Co_{90}Fe_{10}$. The first (second) fixed layer in Comparative Example 13 to Comparative Example 18 and Example 11 to Example 15 has the fcc structure in which the plane (111) is regarded as the lattice matching plane with respect to the magnetic coupling layer.

Thus, the value of the atomic spacing $D_{FM}$ in the plane (111) of the first (second) fixed layer is acquired by dividing the length of the a-axis of the magnetic coupling layer by the square root of two. The lattice mismatch is calculated by Formula: lattice mismatch (%)=$(D_{FM}-D_{NM})/D_{NM}\times100$.

As shown in Table 3, when the lattice mismatch ratios are compared between Comparative Example 13 and Examples 11 to 15, it is understood that the absolute value of the lattice mismatch ratio between the magnetic coupling layer and the first (second) fixed layer formed of $Co_{90}Fe_{10}$ is decreased by including Cr, Mn, Fe, Co, or Ni to Ir of the magnetic coupling layer. In addition, when the lattice mismatch ratios are compared between Comparative Example 13 and Comparative Examples 14 to 18, it is understood that the absolute value of the lattice mismatch ratio between the magnetic coupling layer and the first (second) fixed layer formed of $Co_{90}Fe_{10}$ is increased by including Ta, W, Mo, or Pt to Ir of the magnetic coupling layer.

TABLE 3

| | Magnetic Coupling Layer | First (Second) Fixed Layer | Lattice Mismatch Ratio (%) |
|---|---|---|---|
| Comparative Example 13 | Ir | $Co_{90}Fe_{10}$ | −7.64 |
| Example 11 | $Ir_{0.8}Cr_{0.2}$ | $Co_{90}Fe_{10}$ | −6.68 |
| Example 12 | $Ir_{0.6}Mn_{0.4}$ | $Co_{90}Fe_{10}$ | −6.95 |
| Example 13 | $Ir_{0.5}Fe_{0.5}$ | $Co_{90}Fe_{10}$ | −5.84 |
| Example 14 | $Ir_{0.5}Co_{0.5}$ | $Co_{90}Fe_{10}$ | −4.16 |
| Example 15 | $Ir_{0.5}Ni_{0.5}$ | $Co_{90}Fe_{10}$ | −4.29 |
| Comparative Example 14 | $Ir_{0.9}Ta_{0.1}$ | $Co_{90}Fe_{10}$ | −8.06 |
| Comparative Example 15 | $Ir_3Ta_1$ | $Co_{90}Fe_{10}$ | −8.75 |
| Comparative Example 16 | $Ir_{0.8}W_{0.2}$ | $Co_{90}Fe_{10}$ | −7.73 |
| Comparative Example 17 | $Ir_{0.85}Mo_{0.15}$ | $Co_{90}Fe_{10}$ | −8.03 |
| Comparative Example 18 | $Ir_{0.5}Pt_{0.5}$ | $Co_{90}Fe_{10}$ | −8.54 |

Second Embodiment

Figure 2:
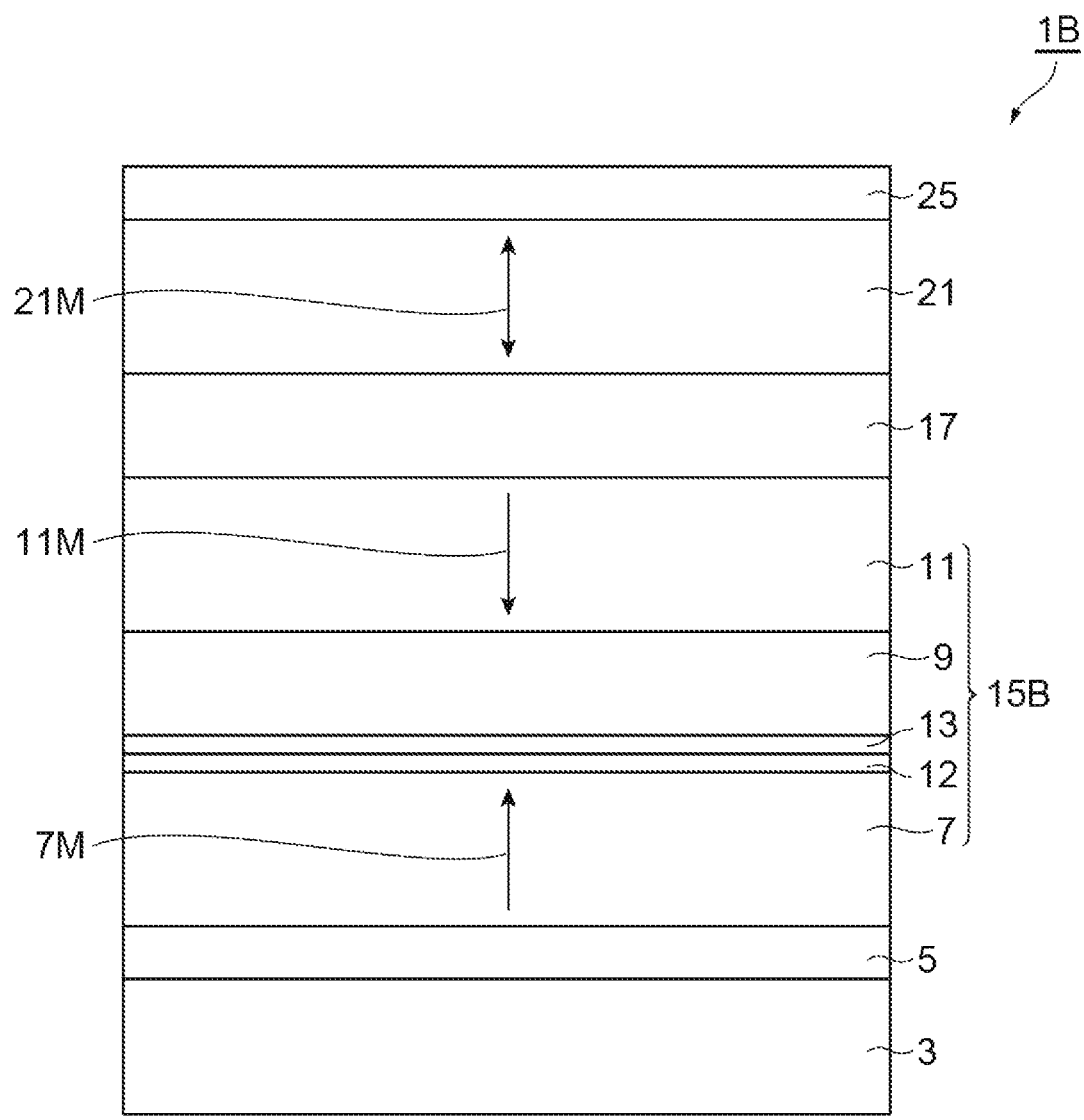
FIG. 2 is a view illustrating a cross-section of a magnetoresistive effect element according to a second embodiment.

Next, a magnetoresistive effect element according to a second embodiment will be described. FIG. 2 is a view illustrating a cross-section of the magnetoresistive effect element according to the second embodiment. A magnetoresistive effect element 1B of the second embodiment is different from the magnetoresistive effect element 1A of the first embodiment in the configuration of the magnetization fixed layer. Specifically, a magnetization fixed layer 15B of the magnetoresistive effect element 1B of the present embodiment further includes a first interposed layer 12 and a second interposed layer 13.

The first interposed layer 12 and the second interposed layer 13 are stacked between the first fixed layer 7 and the magnetic coupling layer 9. The first interposed layer 12 is in contact with the first fixed layer 7, and the second interposed layer 13 is in contact with the first interposed layer 12 and the magnetic coupling layer 9. The main element of each of the magnetic coupling layer 9 and the first interposed layer 12 is Ir. The main element of the second interposed layer 13 is an element other than Ir. The thickness of the first interposed layer 12 is greater than or equal to 1.5 times the atomic radius of Ir and less than or equal to 3.2 times the atomic radius of Ir. The thickness of the second interposed layer 13 is less than or equal to 1.5 times the atomic radius of the main element of the second interposed layer 13.

When the thickness of the first interposed layer 12 is less than twice the atomic radius of Ir, the thickness is less than the thickness of one atom of Ir. In this case, the first interposed layer 12 cannot have a continuous shape in an in-film direction and, for example, has a discontinuous shape such as the shape of a plurality of islands in the in-film direction. In addition, in this case, the thickness of the first interposed layer 12 can be evaluated by elemental analysis such as EDS assuming that the first interposed layer 12 has a uniform thickness by calculating the arithmetic mean of the first interposed layer 12 on the whole upper surface of the first fixed layer 7.

In addition, since the thickness of the second interposed layer 13 is less than or equal to 1.5 times the atomic radius of the main element of the second interposed layer 13, the thickness is less than the thickness of one atom of the main element. In this case, the second interposed layer 13 cannot have a continuous shape in the in-film direction and, for example, has a discontinuous shape such as the shape of a plurality of islands in the in-film direction. In addition, in this case, the thickness of the second interposed layer 13 can be evaluated using the same method as that for the first interposed layer 12.

In the aforementioned magnetoresistive effect element 1B of the present embodiment, the diffusion of the element constituting the first fixed layer 7 to the magnetic coupling layer 9, and the diffusion of the element constituting the magnetic coupling layer 9 to the first fixed layer 7 are suppressed by the presence of the second interposed layer 13. When such diffusion occurs, the abruptness of the interface between the first fixed layer 7 and the magnetic coupling layer 9 is decreased. Thus, in the magnetoresistive effect element 1B of the present embodiment, since the abruptness of the interface between the first fixed layer 7 and the magnetic coupling layer 9 is maintained, a decrease in exchange coupling magnetic field between the first fixed layer 7 and the second fixed layer 11 via the magnetic coupling layer 9 in the SAF structure can be suppressed. In addition, the thicknesses and the arrangement of the first interposed layer 12 and the second interposed layer 13 are determined such that those layers do not substantially affect or sufficiently slightly affect the exchange coupling between the first fixed layer 7 and the second fixed layer 11. Thus, since the antiferromagnetic exchange coupling magnetic field between the first fixed layer 7 and the second fixed layer 11 can be maintained to be strong, the fixing of the magnetization direction 7M of the first fixed layer 7 and the magnetization direction 11M of the second fixed layer 11 along the perpendicular direction is particularly strengthened.

In addition, in the magnetoresistive effect element 1B of the present embodiment, the main element of the second interposed layer 13 is preferably the same as the main element of the first fixed layer 7. In this case, since the same element as the main element of the first fixed layer 7 is present in a region between the first fixed layer 7 and the magnetic coupling layer 9, entropy related to the main element of the first fixed layer 7 is increased, compared to that when a different element is present in the region. Thus, the main element of the first fixed layer 7 is difficult to thermodynamically diffuse toward the magnetic coupling layer 9, compared to that when a different element is present in the region. Consequently, the antiferromagnetic exchange coupling magnetic field between the first fixed layer 7 and the second fixed layer 11 is further strengthened.

Hereinafter, the effect of the magnetoresistive effect element 1B of the present embodiment will be further clearly described using configuration examples and comparative configuration examples.

Configuration Examples 1 to 3 and Comparative Configuration Examples 1 to 3

The magnetization fixed layer in Configuration Example 1 was produced as follows in accordance with the magnetization fixed layer 15B of the magnetoresistive effect element 1B. A 5.0 nm Ta layer, a 20 nm Cu layer, and a 10 nm Ta layer as electrode layers were deposited by sputtering on a Si substrate with a thermal oxide film. Then, the surface was flattened by CMP. Then, a 5.0 nm Co layer as the first fixed layer 7, a 0.22 nm Ir layer as the first interposed layer 12, a 0.10 nm Co layer as the second interposed layer 13, a 0.5 nm Ir layer as the magnetic coupling layer 9, and a 2.0 nm Co layer as the second fixed layer 11 were deposited in this order by sputtering. After the deposition, heat treatment was performed under the conditions of 250° C., one hour, and applied magnetic field strength of 10 kOe. A magnetization curve in Configuration Example 1 was measured by applying a magnetic field in the magnetization direction of the first fixed layer. The antiferromagnetic exchange coupling magnetic field (exchange bias magnetic field $H_{EX}$) between the first fixed layer and the second fixed layer was evaluated from the amount of shift of the measured magnetization curve in the direction of the magnetic field. Then, a magnetic field annealing process was performed in Configuration Example 1 in a vacuum under the conditions of 400° C., one hour, and applied magnetic field strength of 10 kOe. The exchange bias magnetic field $H_{EX}$ was calculated using the same method as described above.

The production of the magnetization fixed layer and the evaluation of the exchange bias magnetic field $H_{EX}$ in Comparative Configuration Example 1 were performed in the same manner as the magnetization fixed layer in Configuration Example 1 except that an Ir layer as the first interposed layer 12 and a Co layer as the second interposed layer 13 were not deposited.

The production of the magnetization fixed layer and the evaluation of the exchange bias magnetic field $H_{EX}$ in Configuration Examples 2 and 3 and Comparative Configuration Examples 2 and 3 were performed in the same manner as the magnetization fixed layer in Configuration Example 1 except that the thickness of the Co layer as the second interposed layer 13 was changed. The thickness of the Co layer as the second interposed layer 13 in Configuration Examples 2 and 3 and Comparative Configuration Examples 2 and 3 is 0.12 nm, 0.15 nm, 0.18 nm, and 0.20 nm, respectively.

Table 4 is a table showing film configurations of the first fixed layer, the first interposed layer, the second interposed layer, the magnetic coupling layer, and the second fixed layer, and the measured values of the exchange bias magnetic field $H_{EX}$ before and after the magnetic field annealing process in Configuration Examples 1 to 3 and Comparative Configuration Examples 1 to 3.

Figure 3:
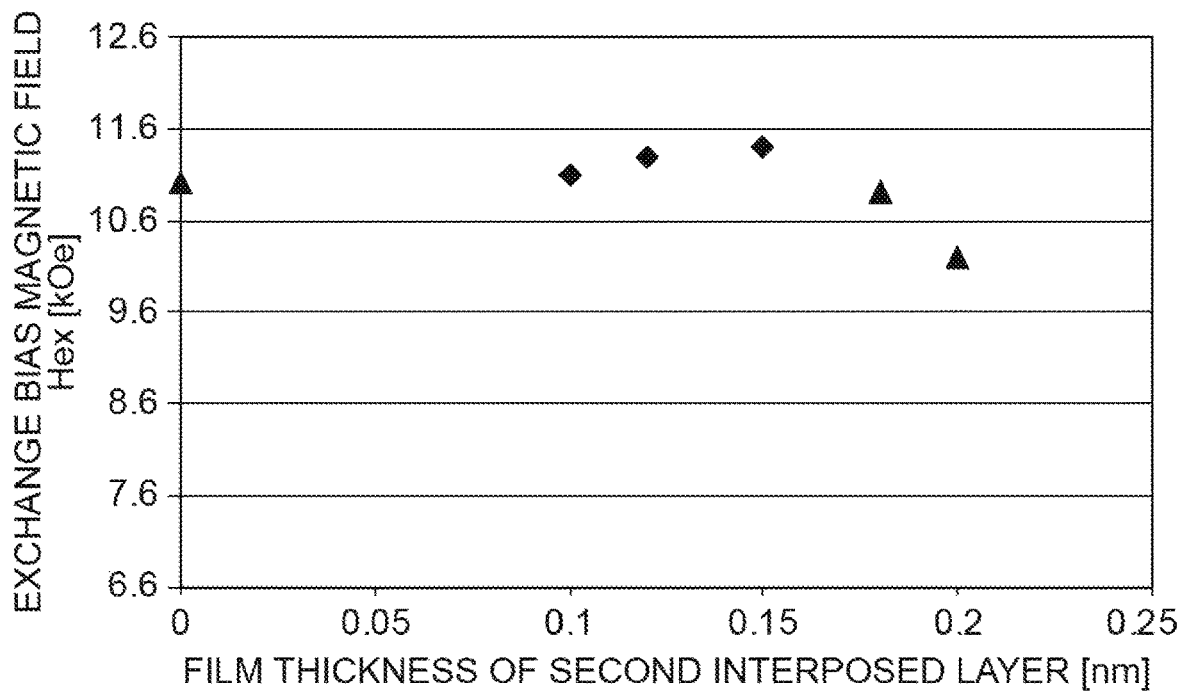
FIG. 3 Part A is a diagram illustrating the dependence of an exchange bias magnetic field $H_{EX}$ on the film thickness of a second interposed layer before an annealing process in Configuration Examples 1 to 3 and Comparative Configuration Examples 1 to 3, and part B is a diagram illustrating the dependence of the exchange bias magnetic field $H_{EX}$ on the film thickness of the second interposed layer after the annealing process in Configuration Examples 1 to 3 and Comparative Configuration Examples 1 to 3.
Figure 3:
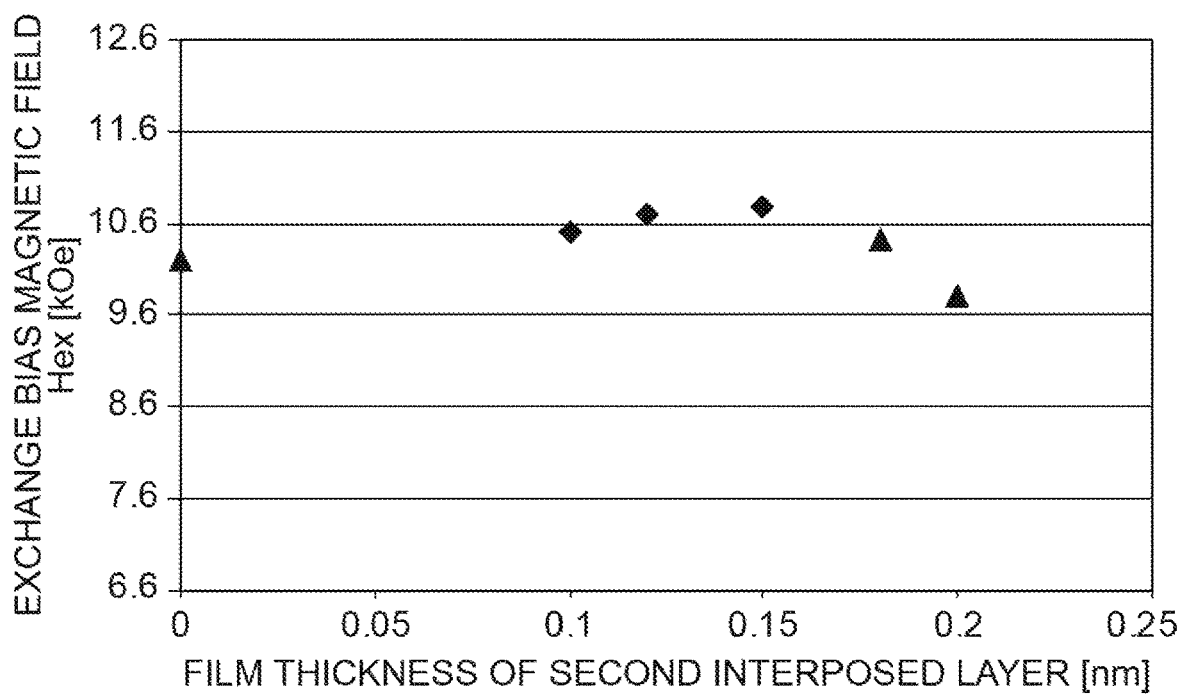

Part A of FIG. 3 is a diagram illustrating the dependence of the exchange bias magnetic field $H_{EX}$ on the film thickness of the second interposed layer before the annealing process in Configuration Examples 1 to 3 and Comparative Configuration Examples 1 to 3. Part B of FIG. 3 is a diagram illustrating the dependence of the exchange bias magnetic field $H_{EX}$ on the film thickness of the second interposed layer after the annealing process in Configuration Examples 1 to 3 and Comparative Configuration Examples 1 to 3. In FIG. 3, each configuration example is illustrated by a plot of ♦, and each comparative configuration example is illustrated by a plot of ▲. The same applies to the plots in FIG. 4 to FIG. 6 below. As illustrated in FIG. 3, the value of $H_{EX}$ before the annealing process and the value of $H_{EX}$ after the annealing process in Configuration Examples 1, 2, and 3 are respectively greater than the value of $H_{EX}$ before the annealing process and the value of $H_{EX}$ after the annealing process in Comparative Configuration Examples 1, 2, and 3. In addition, the rate of decrease in the value of $H_{EX}$ before and after the annealing process in Configuration Examples 1, 2, and 3 is lower than that in Comparative Configuration Example 1.

Configuration Examples 4 to 8 and Comparative Configuration Examples 1 and 4 to 6

The production of the magnetization fixed layer and the evaluation of the exchange bias magnetic field $H_{EX}$ in Configuration Examples 4 to 8 and Comparative Configuration Examples 4 to 6 were performed in the same manner as the magnetization fixed layer in Configuration Example 3 except that the thickness of the Ir layer as the first fixed layer 7 was changed. The thickness of the Ir layer as the first fixed layer 7 in Configuration Examples 4 to 8 and Comparative Configuration Examples 4 to 6 is 0.10 nm, 0.15 nm, 0.20 nm, 0.22 nm, 0.25 nm, 0.30 nm, 0.40 nm, and 0.45 nm, respectively.

TABLE 4

|  | First Fixed Layer (nm) | First Interposed Layer (nm) | Second Interposed Layer (nm) | Magnetic Coupling Layer (nm) | Second Fixed Layer (nm) | $H_{EX}$ before Annealing Process (kOe) | $H_{EX}$ after Annealing Process (kOe) |
| --- | --- | --- | --- | --- | --- | --- | --- |
| Comparative Configuration Example 1 | Co (5.0) | Not Provided | Not Provided | Ir (0.5 nm) | Co (2.0) | 11.0 | 10.2 |
| Configuration Example 1 | Co (5.0) | Ir (0.22) | Co (0.10) | Ir (0.5 nm) | Co (2.0) | 11.1 | 10.5 |
| Configuration Example 2 | Co (5.0) | Ir (0.22) | Co (0.12) | Ir (0.5 nm) | Co (2.0) | 11.3 | 10.7 |
| Configuration Example 3 | Co (5.0) | Ir (0.22) | Co (0.15) | Ir (0.5 nm) | Co (2.0) | 11.4 | 10.8 |
| Comparative Configuration Example 2 | Co (5.0) | Ir (0.22) | Co (0.18) | Ir (0.5 nm) | Co (2.0) | 10.9 | 10.4 |
| Comparative Configuration Example 3 | Co (5.0) | Ir (0.22) | Co (0.20) | Ir (0.5 nm) | Co (2.0) | 10.2 | 9.8 |

Since the atomic radius of the Co element is 0.116 nm, the thickness of the second interposed layer in Configuration Examples 1, 2, and 3 is less than or equal to 1.5 times (0.174 nm) the atomic radius of the Co element. In Comparative Configuration Examples 2 and 3, the thickness of the second interposed layer is greater than 1.5 times the atomic radius of the Co element.

Table 5 is a table showing film configurations of the first fixed layer, the first interposed layer, the second interposed layer, the magnetic coupling layer, and the second fixed layer, and the measured value of the exchange bias magnetic field $H_{EX}$ before and after the magnetic field annealing process in Configuration Examples 4 to 8 and Comparative Configuration Examples 1 and 4 to 6.

TABLE 5

| | First Fixed Layer (nm) | First Interposed Layer (nm) | Second Interposed Layer (nm) | Magnetic Coupling Layer (nm) | Second Fixed Layer (nm) | $H_{EX}$ before Annealing Process (kOe) | $H_{EX}$ after Annealing Process (kOe) |
|---|---|---|---|---|---|---|---|
| Comparative Configuration Example 1 | Co (5.0) | Not Provided | Not Provided | Ir (0.5 nm) | Co (2.0) | 11.0 | 10.2 |
| Comparative Configuration Example 4 | Co (5.0) | Ir (0.10) | Co (0.15) | Ir (0.5 nm) | Co (2.0) | 7.8 | 9.2 |
| Comparative Configuration Example 5 | Co (5.0) | Ir (0.15) | Co (0.15) | Ir (0.5 nm) | Co (2.0) | 9.8 | 10.0 |
| Configuration Example 4 | Co (5.0) | Ir (0.20) | Co (0.15) | Ir (0.5 nm) | Co (2.0) | 10.8 | 10.6 |
| Configuration Example 5 | Co (5.0) | Ir (0.22) | Co (0.15) | Ir (0.5 nm) | Co (2.0) | 11.4 | 10.7 |
| Configuration Example 6 | Co (5.0) | Ir (0.25) | Co (0.15) | Ir (0.5 nm) | Co (2.0) | 11.5 | 10.8 |
| Configuration Example 7 | Co (5.0) | Ir (0.30) | Co (0.15) | Ir (0.5 nm) | Co (2.0) | 11.2 | 10.8 |
| Configuration Example 8 | Co (5.0) | Ir (0.40) | Co (0.15) | Ir (0.5 nm) | Co (2.0) | 11.1 | 10.6 |
| Comparative Configuration Example 6 | Co (5.0) | Ir (0.45) | Co (0.15) | Ir (0.5 nm) | Co (2.0) | 10.0 | 8.0 |

Since the atomic radius of the Ir element is 0.127 nm, the thickness of the first interposed layer in Configuration Examples 4 to 8 is greater than or equal to 1.5 times (0.1905 nm) and less than or equal to 3.2 times (0.4064 nm) the atomic radius of the Ir element. The thickness of the first interposed layer in Comparative Configuration Examples 4 and 5 is less than 1.5 times the atomic radius of the Ir element. The thickness of the first interposed layer in Comparative Configuration Example 6 is greater than 3.2 times the atomic radius of the Ir element.

Figure 4:
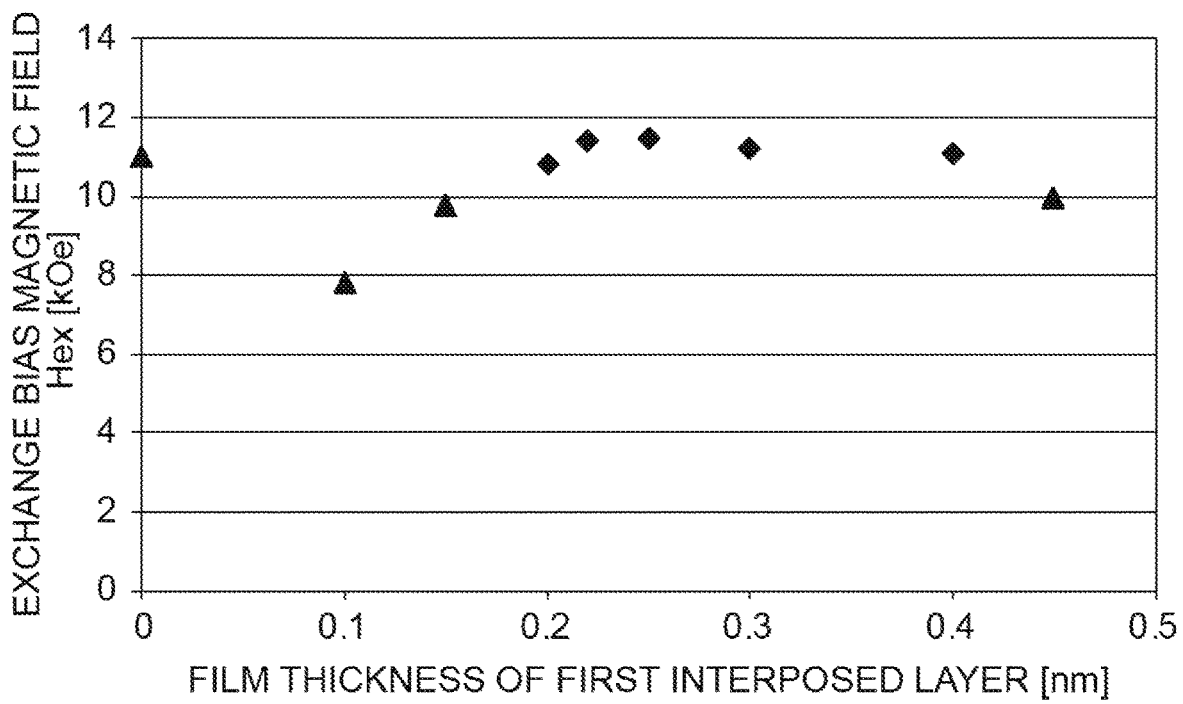
FIG. 4 Part A is a diagram illustrating the dependence of the exchange bias magnetic field $H_{EX}$ on the film thickness of a first interposed layer before the annealing process in Configuration Examples 4 to 8 and Comparative Configuration Examples 1 and 4 to 6, and part B is a diagram illustrating the dependence of the exchange bias magnetic field $H_{EX}$ on the film thickness of the first interposed layer after the annealing process in Configuration Examples 4 to 8 and Comparative Configuration Examples 1 and 4 to 6.
Figure 4:
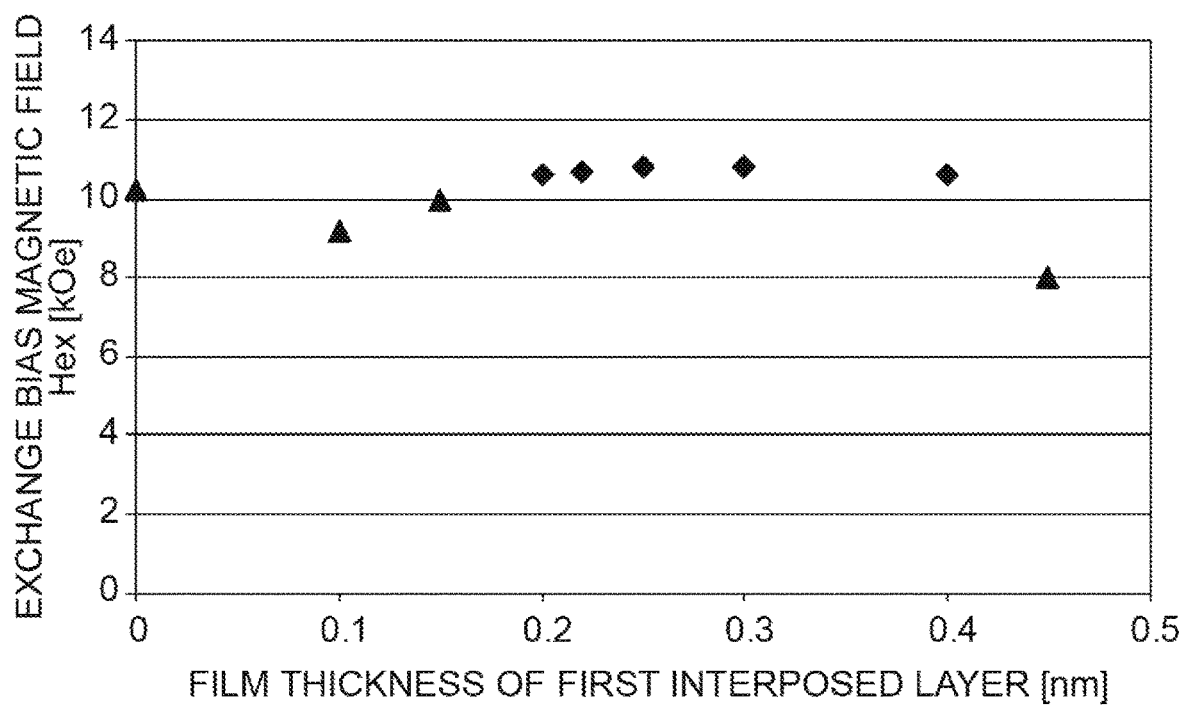

Part A of FIG. 4 is a diagram illustrating the dependence of the exchange bias magnetic field $H_{EX}$ on the film thickness of the first interposed layer before the annealing process in Configuration Examples 4 to 8 and Comparative Configuration Examples 1 and 4 to 6. Part B of FIG. 4 is a diagram illustrating the dependence of the exchange bias magnetic field $H_{EX}$ on the film thickness of the first interposed layer after the annealing process in Configuration Examples 4 to 8 and Comparative Configuration Examples 1 and 4 to 6. As illustrated in FIG. 4, the value of $H_{EX}$ after the annealing process in Configuration Examples 4 to 8 is greater than the value of $H_{EX}$ after the annealing process in Comparative Configuration Examples 1 and 6. In addition, the rate of decrease in the value of $H_{EX}$ before and after the annealing process in Configuration Examples 4 to 8 is lower than that in Comparative Configuration Example 1.

Configuration Examples 9 to 13 and Comparative Configuration Examples 1 and 7

The production of the magnetization fixed layer and the evaluation of the exchange bias magnetic field $H_{EX}$ in Configuration Examples 9 to 13 and Comparative Configuration Example 7 were performed in the same manner as the magnetization fixed layer in Configuration Example 1 except that the constituent material and the thickness of the layer as the second fixed layer 11 were changed. The constituent material of the layer as the second fixed layer 11 in Configuration Examples 9 to 13 and Comparative Configuration Examples 1 and 7 is Mo. The thickness of the Mo layer as the second fixed layer 11 in Configuration Examples 9 to 13 and Comparative Configuration Example 7 is 0.05 nm, 0.10 nm, 0.12 nm, 0.15 nm, 0.18 nm, and 0.20 nm, respectively.

Table 6 is a table showing film configurations of the first fixed layer, the first interposed layer, the second interposed layer, the magnetic coupling layer, and the second fixed layer, and the measured value of the exchange bias magnetic field $H_{EX}$ before and after the magnetic field annealing process in Configuration Examples 9 to 13 and Comparative Configuration Examples 1 and 7.

TABLE 6

| | First Fixed Layer (nm) | First Interposed Layer (nm) | Second Interposed Layer (nm) | Magnetic Coupling Layer (nm) | Second Fixed Layer (nm) | $H_{EX}$ before Annealing Process (kOe) | $H_{EX}$ after Annealing Process (kOe) |
|---|---|---|---|---|---|---|---|
| Comparative Configuration Example 1 | Co (5.0) | Not Provided | Not Provided | Ir (0.5 nm) | Co (2.0) | 11.0 | 10.2 |
| Configuration Example 9 | Co (5.0) | Ir (0.22) | Mo (0.05) | Ir (0.5 nm) | Co (2.0) | 11.4 | 11.2 |
| Configuration Example 10 | Co (5.0) | Ir (0.22) | Mo (0.10) | Ir (0.5 nm) | Co (2.0) | 11.1 | 11.1 |
| Configuration Example 11 | Co (5.0) | Ir (0.22) | Mo (0.12) | Ir (0.5 nm) | Co (2.0) | 11.2 | 11.2 |
| Configuration Example 12 | Co (5.0) | Ir (0.22) | Mo (0.15) | Ir (0.5 nm) | Co (2.0) | 11.3 | 11.2 |

TABLE 6-continued

|  | First Fixed Layer (nm) | First Interposed Layer (nm) | Second Interposed Layer (nm) | Magnetic Coupling Layer (nm) | Second Fixed Layer (nm) | $H_{EX}$ before Annealing Process (kOe) | $H_{EX}$ after Annealing Process (kOe) |
| --- | --- | --- | --- | --- | --- | --- | --- |
| Configuration Example 13 | Co (5.0) | Ir (0.22) | Mo (0.18) | Ir (0.5 nm) | Co (2.0) | 11.1 | 11.1 |
| Comparative Configuration Example 7 | Co (5.0) | Ir (0.22) | Mo (0.2) | Ir (0.5 nm) | Co (2.0) | 10.2 | 10.2 |

Since the atomic radius of the Mo element is 0.130 nm, the thickness of the second interposed layer in Configuration Examples 9 to 13 is less than or equal to 1.5 times (0.195 nm) the atomic radius of the Mo element. In Comparative Configuration Example 7, the thickness of the second interposed layer is greater than 1.5 times the atomic radius of the Mo element.

Figure 5:
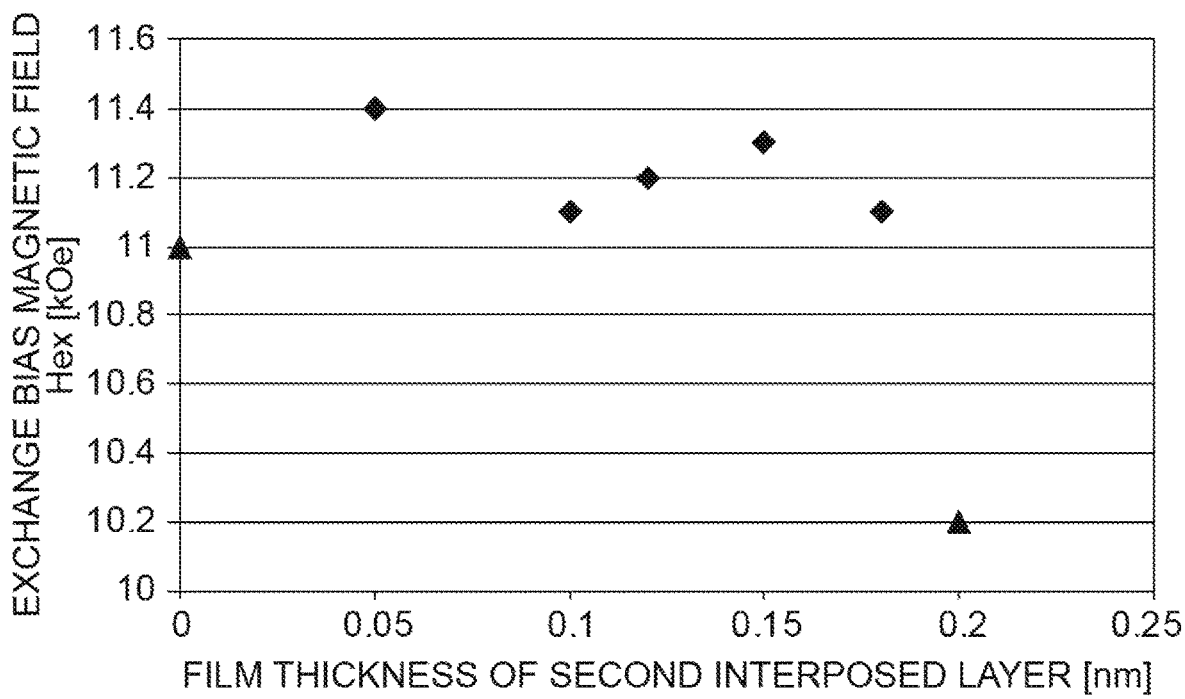
FIG. 5 Part A is a diagram illustrating the dependence of the exchange bias magnetic field $H_{EX}$ on the film thickness of the second interposed layer before the annealing process in Configuration Examples 9 to 13 and Comparative Configuration Examples 1 and 7, and part B is a diagram illustrating the dependence of the exchange bias magnetic field $H_{EX}$ on the film thickness of the second interposed layer after the annealing process in Configuration Examples 9 to 13 and Comparative Configuration Examples 1 and 7.
Figure 5:
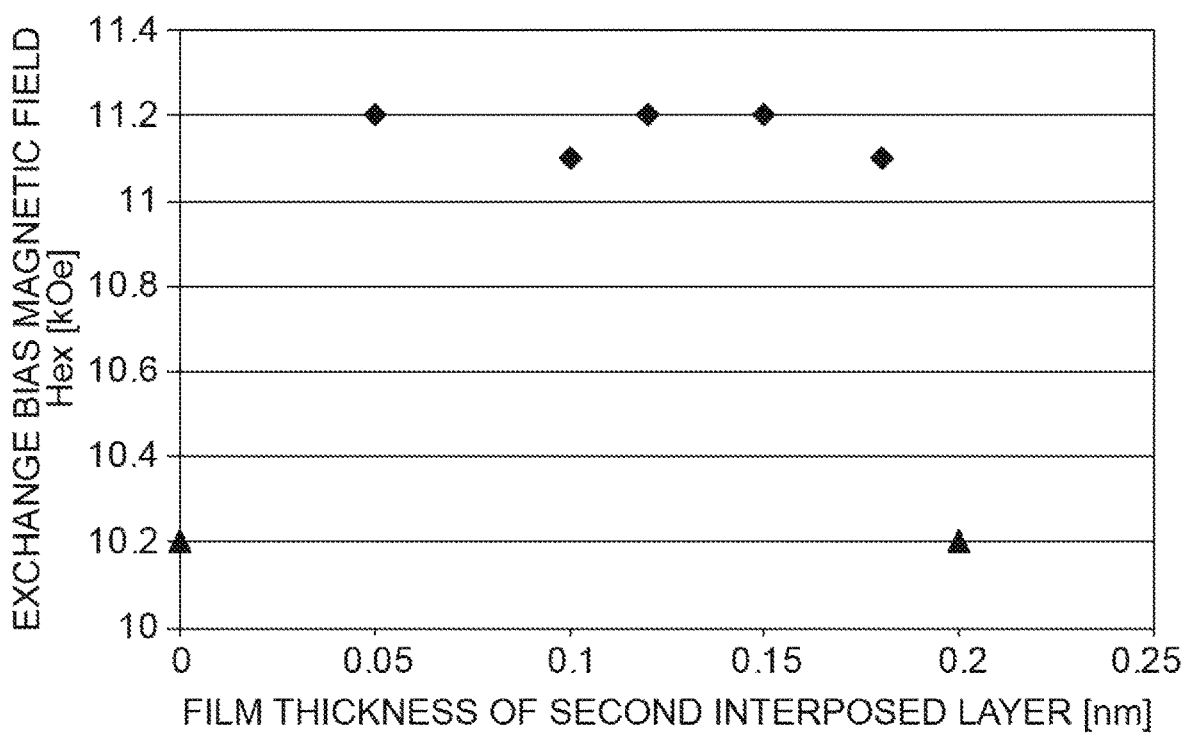

Part A of FIG. 5 is a diagram illustrating the dependence of the exchange bias magnetic field $H_{EX}$ on the film thickness of the second interposed layer before the annealing process in Configuration Examples 9 to 13 and Comparative Configuration Examples 1 and 7. Part B of FIG. 5 is a diagram illustrating the dependence of the exchange bias magnetic field $H_{EX}$ on the film thickness of the second interposed layer after the annealing process in Configuration Examples 9 to 13 and Comparative Configuration Examples 1 and 7. As illustrated in FIG. 5, the value of $H_{EX}$ before the annealing process and the value of $H_{EX}$ after the annealing process in Configuration Examples 9 to 13 are respectively greater than the value of $H_{EX}$ before the annealing process and the value of $H_{EX}$ after the annealing process in Comparative Configuration Examples 1 and 7. In addition, the rate of decrease in the value of $H_{EX}$ before and after the annealing process in Configuration Examples 9 to 13 is lower than that in Comparative Configuration Example 1.

Configuration Example 14 and Comparative Configuration Example 1

The production of the magnetization fixed layer and the evaluation of the exchange bias magnetic field $H_{EX}$ in Configuration Example 14 were performed in the same manner as the magnetization fixed layer in Configuration Example 3 except that the constituent material and the thickness of the layer as the second fixed layer 11 were changed. The constituent material of the layer as the second fixed layer 11 in Configuration Example 14 is Pd. The thickness of the Mo layer as the second fixed layer 11 in Configuration Example 14 is 0.15 nm. In addition, 1,000 magnetization fixed layers in Configuration Example 14 and Comparative Configuration Example 1 were produced under the same production conditions. For each of the plurality of magnetization fixed layers in Configuration Example 14 and Comparative Configuration Example 1, the variation (standard deviation σ) of the exchange bias magnetic field $H_{EX}$ before the magnetic field annealing process and the variance (standard deviation σ) of the exchange bias magnetic field $H_{EX}$ after the magnetic field annealing process were acquired.

Table 7 is a table showing film configurations of the first fixed layer, the first interposed layer, the second interposed layer, the magnetic coupling layer, and the second fixed layer, and the measured value of the exchange bias magnetic field $H_{EX}$ before and after the magnetic field annealing process in Configuration Example 14 and Comparative Configuration Example 1.

TABLE 7

|  | First Fixed Layer (nm) | First Interposed Layer (nm) | Second Interposed Layer (nm) | Magnetic Coupling Layer (nm) | Second Fixed Layer (nm) | $H_{EX}$ before Annealing Process (kOe) | $H_{EX}$ after Annealing Process (kOe |
| --- | --- | --- | --- | --- | --- | --- | --- |
| Comparative Configuration Example 1 | Co (5.0) | Not Provided | Not Provided | Ir (0.5 nm) | Co (2.0) | 11.0 | 10.2 |
| Configuration Example 14 | Co (5.0) | Ir (0.22) | Pd (0.15) | Ir (0.5 nm) | Co (2.0) | 11.2 | 10.8 |

Since the atomic radius of the Pd element is 0.128 nm, the thickness of the second interposed layer in Configuration Example 14 is less than or equal to 1.5 times (0.192 nm) the atomic radius of the Pd element.

As shown in Table 7, the value of $H_{EX}$ before the annealing process and the value of $H_{EX}$ after the annealing process in Configuration Example 14 are respectively greater than the value of $H_{EX}$ before the annealing process and the value of $H_{EX}$ after the annealing process in Comparative Configuration Example 1. In addition, the rate of decrease in the value of $H_{EX}$ before and after the annealing process in Configuration Example 14 is lower than that in Comparative Configuration Example 1. In addition, while the variation (standard deviation σ) of the exchange bias magnetic field $H_{EX}$ before the magnetic field annealing process in Comparative Configuration Example 1 is 7.20%, and the variation (standard deviation σ) of the exchange bias magnetic field $H_{EX}$ after the magnetic field annealing process in Comparative Configuration Example 1 is 13.10%, the variation (standard deviation σ) of the exchange bias magnetic field $H_{Ex}$ before the magnetic field annealing process in Configuration Example 14 is 4.20%, and the variation (standard deviation σ) of the exchange bias magnetic field $H_{EX}$ after the magnetic field annealing process in Comparative Configuration Example 1 is 14.90%.

Configuration Examples 15 to 19 and Comparative Configuration Examples 1 and 8

The production of the magnetization fixed layer and the evaluation of the exchange bias magnetic field $H_{EX}$ in Configuration Examples 15 to 19 and Comparative Configuration Example 8 were performed in the same manner as the magnetization fixed layer in Configuration Example 1 except that the constituent material and the thickness of the layer as the second fixed layer 11 were changed. The constituent material of the layer as the second fixed layer 11 in Configuration Examples 15 to 19 and Comparative Configuration Example 8 is W. The thickness of the W layer as the second fixed layer 11 in Configuration Examples 15 to 19 and Comparative Configuration Example 8 is 0.06 nm, 0.10 nm, 0.12 nm, 0.15 nm, 0.17 nm, and 0.20 nm, respectively.

Table 8 is a table showing film configurations of the first fixed layer, the first interposed layer, the second interposed layer, the magnetic coupling layer, and the second fixed layer, and the measured value of the exchange bias magnetic field $H_{EX}$ before and after the magnetic field annealing process in Configuration Examples 15 to 19 and Comparative Configuration Examples 1 and 8.

TABLE 8

| | First Fixed Layer (nm) | First Interposed Layer (nm) | Second Interposed Layer (nm) | Magnetic Coupling Layer (nm) | Second Fixed Layer (nm) | $H_{EX}$ before Annealing Process (kOe) | $H_{EX}$ after Annealing Process (kOe) |
|---|---|---|---|---|---|---|---|
| Comparative Configuration Example 1 | Co (5.0) | Not Provided | Not Provided | Ir (0.5 nm) | Co (2.0) | 11.0 | 10.2 |
| Configuration Example 15 | Co (5.0) | Ir (0.22) | W (0.06) | Ir (0.5 nm) | Co (2.0) | 11.4 | 11.2 |
| Configuration Example 16 | Co (5.0) | Ir (0.22) | W (0.10) | Ir (0.5 nm) | Co (2.0) | 11.1 | 11.1 |
| Configuration Example 17 | Co (5.0) | Ir (0.22) | W (0.12) | Ir (0.5 nm) | Co (2.0) | 11.2 | 11.2 |
| Configuration Example 18 | Co (5.0) | Ir (0.22) | W (0.15) | Ir (0.5 nm) | Co (2.0) | 11.3 | 11.2 |
| Configuration Example 19 | Co (5.0) | Ir (0.22) | W (0.17) | Ir (0.5 nm) | Co (2.0) | 11.1 | 11.1 |
| Comparative Configuration Example 8 | Co (5.0) | Ir (0.22) | W (0.20) | Ir (0.5 nm) | Co (2.0) | 10.2 | 10.2 |

Since the atomic radius of the W element is 0.130 nm, the thickness of the second interposed layer in Configuration Examples 15 to 19 is less than or equal to 1.5 times (0.195 nm) the atomic radius of the W element. In Comparative Configuration Example 8, the thickness of the second interposed layer is greater than 1.5 times the atomic radius of the W element.

Figure 6:
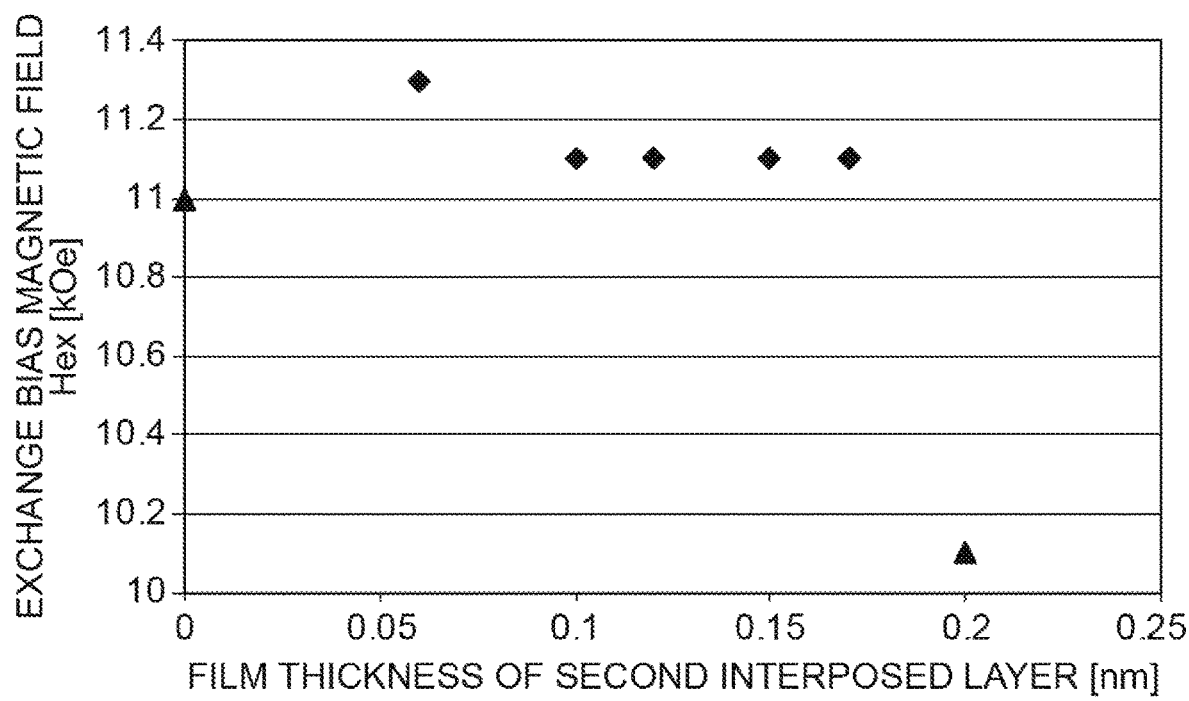
FIG. 6 Part A is a diagram illustrating the dependence of the exchange bias magnetic field $H_{EX}$ on the film thickness of the second interposed layer before the annealing process in Configuration Examples 15 to 19 and Comparative Configuration Examples 1 and 8, and part B is a diagram illustrating the dependence of the exchange bias magnetic field $H_{EX}$ on the film thickness of the second interposed layer after the annealing process in Configuration Examples 15 to 19 and Comparative Configuration Examples 1 and 8.
Figure 6:
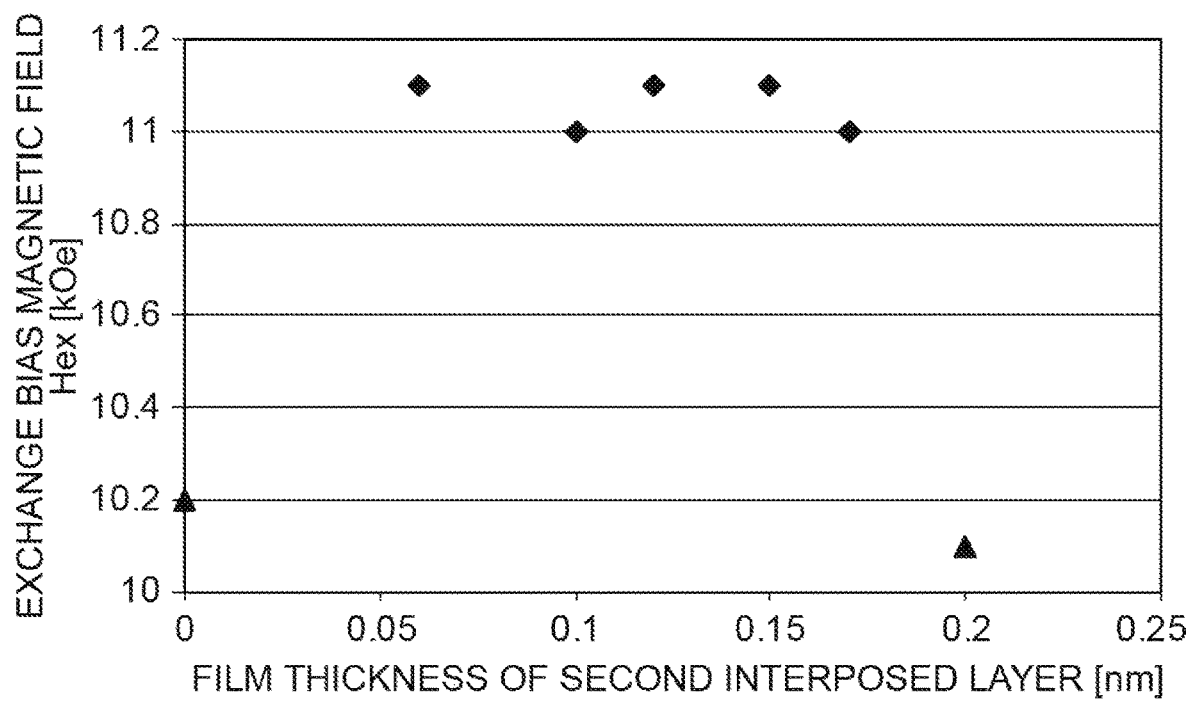

Part A of FIG. 6 is a diagram illustrating the dependence of the exchange bias magnetic field $H_{EX}$ on the film thickness of the second interposed layer before the annealing process in Configuration Examples 15 to 19 and Comparative Configuration Examples 1 and 8. Part B of FIG. 6 is a diagram illustrating the dependence of the exchange bias magnetic field $H_{EX}$ on the film thickness of the second interposed layer after the annealing process in Configuration Examples 15 to 19 and Comparative Configuration Examples 1 and 8. As illustrated in FIG. 6, the value of $H_{EX}$ before the annealing process and the value of $H_{EX}$ after the annealing process in Configuration Examples 15 to 19 are respectively greater than the value of $H_{EX}$ before the annealing process and the value of $H_{EX}$ after the annealing process in Comparative Configuration Examples 1 and 8. In addition, the rate of decrease in the value of $H_{EX}$ before and after the annealing process in Configuration Examples 15 to 19 is lower than that in Comparative Configuration Example 1.

Third Embodiment

Figure 7:
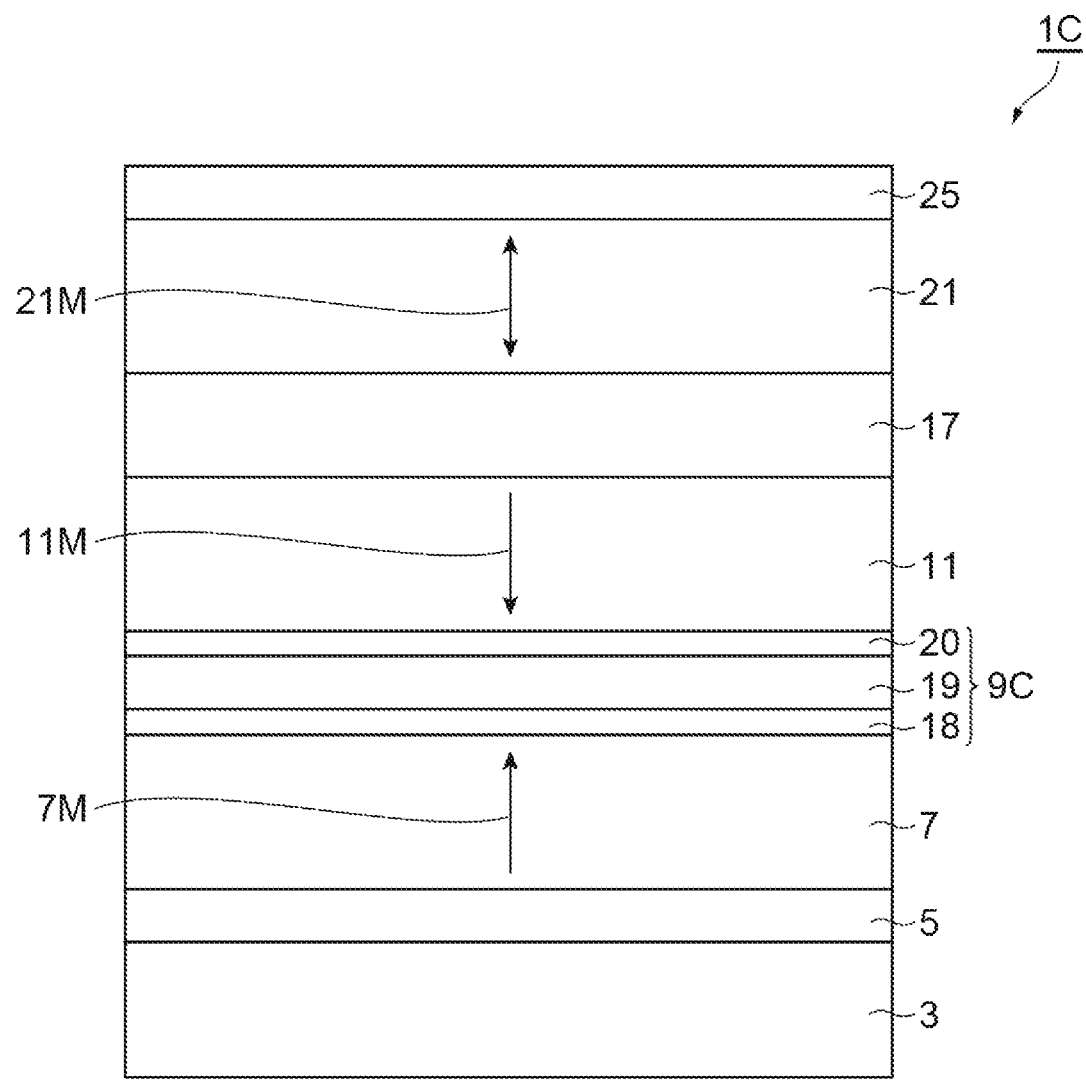
FIG. 7 is a view illustrating a cross-section of a magnetoresistive effect element according to a third embodiment.

Next, a magnetoresistive effect element according to a third embodiment will be described. FIG. 7 is a view illustrating a cross-section of the magnetoresistive effect element according to the third embodiment. A magnetoresistive effect element 1C of the third embodiment is different from the magnetoresistive effect element 1A of the first embodiment in the configuration of the magnetic coupling layer. Specifically, a magnetic coupling layer 9C of the magnetoresistive effect element 1C of the present embodiment includes a first non-magnetic layer 18, a second non-magnetic layer 20, and an intermediate non-magnetic layer 19 that is stacked between the first non-magnetic layer 18 and the second non-magnetic layer 20.

The first non-magnetic layer 18 and the second non-magnetic layer 20 are formed of the same material as the magnetic coupling layer 9 of the first embodiment. That is, each of the first non-magnetic layer 18 and the second non-magnetic layer 20 is a non-magnetic layer that is formed of a conductive material and, specifically, includes Ir and at least one of the following five kinds of elements: Cr, Mn, Fe, Co, and Ni. In addition, the intermediate non-magnetic layer 19 is formed of Ir or Ru. The thickness of each of the first non-magnetic layer 18 and the second non-magnetic layer 20 can be, for example, greater than or equal to 0.1 nm and less than or equal to 1.0 nm. The thickness of the intermediate non-magnetic layer 19 can be, for example, greater than or equal to 0.1 nm and less than or equal to 2.0 nm. The thickness of the magnetic coupling layer 9C can be, for example, greater than or equal to 0.1 nm and less than or equal to 1.0 nm.

In the aforementioned magnetoresistive effect element 1C of the present embodiment, the first non-magnetic layer 18 and the second non-magnetic layer 20 are formed of the same material as the magnetic coupling layer 9 of the first embodiment, and are in contact with the first fixed layer 7 and the second fixed layer 11, respectively. Thus, based on the same principle as the case of the magnetoresistive effect element 1A of the first embodiment, the value of the uniaxial anisotropy energy Ku in the perpendicular direction of the first fixed layer 7 and the second fixed layer 11 can be increased to the positive side. Furthermore, since the intermediate non-magnetic layer 19 that is formed of Ir or Ru and does not substantially include other elements is included in the magnetic coupling layer 9C between the first non-magnetic layer 18 and the second non-magnetic layer 20, the exchange coupling magnetic field in the SAF structure can be particularly strengthened. Consequently, the fixing of the magnetization direction 7M of the first fixed layer 7 and the magnetization direction 11M of the second fixed layer 11 along the perpendicular direction is particularly strengthened.

Fourth Embodiment

Figure 8:
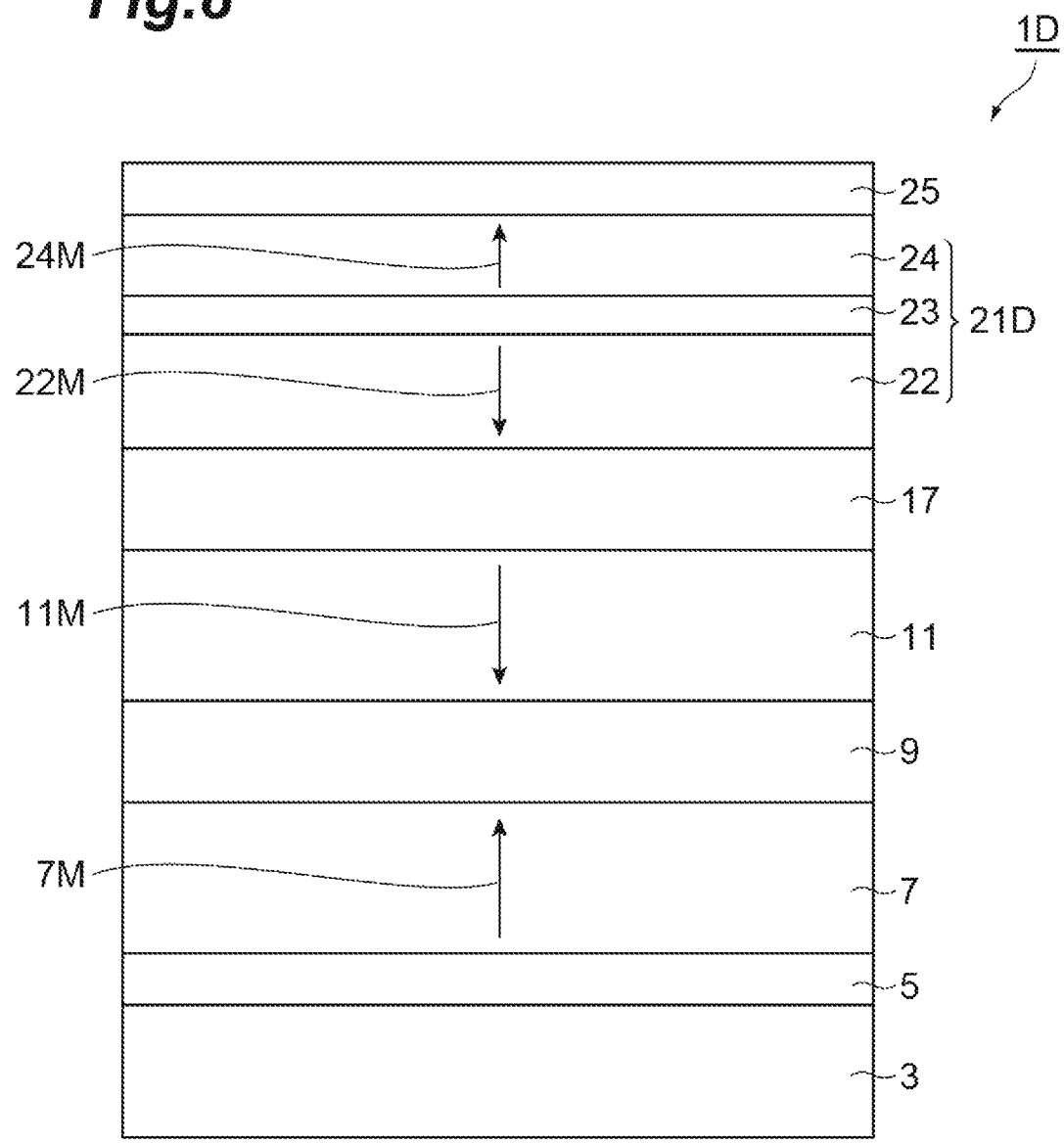
FIG. 8 is a view illustrating a cross-section of a magnetoresistive effect element according to a fourth embodiment.

Next, a magnetoresistive effect element according to a fourth embodiment will be described. FIG. 8 is a view illustrating a cross-section of the magnetoresistive effect element according to the fourth embodiment. A magnetoresistive effect element 1D of the fourth embodiment is different from the magnetoresistive effect element 1A of the first embodiment in the configuration of the magnetization free layer. Specifically, a magnetization free layer 21D of the magnetoresistive effect element 1D of the present embodiment includes a first free layer 22, a second free layer 24, and a magnetic coupling layer 23 that is stacked between the first free layer 22 and the second free layer 24.

The first free layer 22 and the second free layer 24 are formed of a ferromagnetic material and are formed of, for example, the same material as the magnetization free layer 21 of the magnetoresistive effect element 1A of the first embodiment. Each of the first free layer 22 and the second free layer 24 may be formed of a ferromagnetic material such as Co, Ni, or an alloy of Co and Ni, and mat have, for example, a face-centered cubic structure (fcc structure) or a hexagonal close-packed structure (hcp structure). The magnetic coupling layer 23 is a non-magnetic layer that is formed of a conductive material and is formed of, for example, Ir, Ru, or an alloy including any or both of Ir and Ru. The first free layer 22 and the second free layer 24 are magnetically coupled to each other by exchange coupling via the magnetic coupling layer 23 such that a magnetization direction 22M of the first free layer 22 and a magnetization direction 24M of the second free layer 24 are antiparallel to each other. That is, in the magnetoresistive effect element 1D of the present embodiment, the magnetization free layer 21D has the SAF structure.

The magnetic coupling layer 23 may include Ir and at least one of the following five kinds of elements: Cr, Mn, Fe, Co and Ni. The form in which the magnetic coupling layer 23 includes at least one of Cr, Mn, Fe, Co and Ni is not particularly limited. For example, at least one of Cr, Mn, Fe, Co and Ni can be included in the magnetic coupling layer 23 in the form of an alloy with Ir, the form of a compound with Ir, the form of a substitutional defect in a crystal formed of Ir or an Ir compound, or the form of an additive for a crystal formed of Ir or an Ir compound. The magnetic coupling layer 23 preferably includes Ir as a main element. In addition, the magnetic coupling layer 23 has, for example, the fcc structure or the hcp structure.

The thickness of each of the first free layer 22 and the second free layer 24 can be, for example, greater than or equal to 0.5 nm and less than or equal to 2.0 nm. The thickness of the magnetic coupling layer 23 can be, for example, greater than or equal to 0.3 nm and less than or equal to 2.0 nm. The thickness of the magnetization free layer 21D can be, for example, greater than or equal to 0.5 nm and less than or equal to 2.0 nm.

Each of the first free layer 22 and the second free layer 24 has an easy magnetization axis along the perpendicular direction. In addition, the magnitude of the magnetization direction 22M of the first free layer 22 and the magnitude of the magnetization direction 24M of the second free layer 24 are preferably equal to each other but may be different from each other. By applying an external magnetic field of a measurement target, a spin torque, or the like to the magnetization free layer 21D, while the antiparallel relationship between the magnetization direction 22M and the magnetization direction 24M is almost maintained, the magnetization direction 22M can be reversed from the upward perpendicular direction to the downward perpendicular direction or in the opposite direction, and the magnetization direction 24M can be reversed from the downward perpendicular direction to the upward perpendicular direction or in the opposite direction. In addition, when the magnitude of the magnetization direction 22M of the first free layer 22 is different from the magnitude of the magnetization direction 24M of the second free layer 24, an effective magnetic field from magnetization that does not offset and remains is applied to the first free layer 22 or the second free layer 24. Thus, a magnetic field assist effect at the time of reversing the magnetization direction can be achieved.

In the aforementioned magnetoresistive effect element 1D, the magnetization direction (the magnetization direction 22M and the magnetization direction 24M) of the magnetization free layer 21D as a whole is resistant to thermal agitation. Thus, the magnetoresistive effect element 1D has high thermal stability.

In addition, in the aforementioned magnetoresistive effect element 1D according to the present embodiment, the magnetic coupling layer 23 may include at least one of Cr, Mn, Fe, Co and Ni in addition to Ir such that the lattice mismatch ratio with respect to the first free layer 22 and the second free layer 24 is decreased, compared to that in a case where the magnetic coupling layer 23 is assumed to be formed of only Ir. For example, when the atomic spacing in the lattice matching plane of each of the first free layer 22 and the second free layer 24 is smaller than the atomic spacing in the lattice matching plane of the magnetic coupling layer 23 in a case where the magnetic coupling layer 23 is assumed to be formed of only Ir, the magnetic coupling layer 23 may include at least one of Cr, Mn, Fe, Co and Ni such that the atomic spacing of the magnetic coupling layer 9 is decreased.

Accordingly, since the distortion of the first free layer 22 and the second free layer 24 by the magnetic coupling layer 23 such that the crystal axial ratio c/a is decreased can be reduced, the negative uniaxial anisotropy energy Ku of the first free layer 22 and the magnetic coupling layer 23 can be reduced (that is, the value of the uniaxial anisotropy energy Ku can be increased to the positive side). Thus, since the magnetization direction 22M of the first free layer 22 and the magnetization direction 24M of the second free layer 24 become easier to be directed in the perpendicular direction, the fixing of the magnetization direction 22M of the first free layer 22 and the magnetization direction 24M of the second free layer 24 along the perpendicular direction can be strengthened. The lattice mismatch ratio between the magnetic coupling layer 23 and the first free layer 22 or the second free layer 24 is defined by Expression $(D_{FM}-D_{NM})/D \times 100$ when the atomic spacing in the lattice matching plane of the magnetic coupling layer 23 is denoted by $D_{NM}$, and the atomic spacing in the lattice matching plane of the first free layer 22 or the second free layer 24 is denoted by $D_{FM}$.

In the aforementioned magnetoresistive effect element 1D according to the present embodiment, the absolute value of the lattice mismatch ratio between the magnetic coupling layer 23 and the first free layer 22 or the second free layer 24 is preferably less than or equal to 7%. In this case, the value of the uniaxial anisotropy energy Ku in the perpendicular direction of the first free layer 22 and the second free layer 24 can be sufficiently increased to the positive side, compared to that in a case where the magnetic coupling layer 23 is assumed to be formed of only Ir. Thus, the fixing of the magnetization direction 22M of the first free layer 22 and the magnetization direction 22M of the second free layer 24 along the perpendicular direction is particularly strengthened.

In addition, in the aforementioned magnetoresistive effect element 1D according to the present embodiment, the thickness of the magnetic coupling layer 23 is preferably less than or equal to 1 nm. In this case, an antiferromagnetic exchange coupling magnetic field between the first free layer 22 and the second free layer 24 via the magnetic coupling layer 23 can be particularly strengthened. Thus, the fixing of the magnetization direction 22M of the first free layer 22 and the magnetization direction 24M of the second free layer 24 along the perpendicular direction is particularly strengthened.

In addition, in the aforementioned magnetoresistive effect element 1D according to the present embodiment, at least one of the first free layer 22 and the second free layer 24 preferably has a stack structure represented by [Co/Pt]n, [Co/Pd]n, or [Co/Ni]n. Since in these stack structures, the uniaxial anisotropy energy Ku in the perpendicular direction can be particularly increased, the fixing of the magnetization direction 22M of the first free layer 22 and the magnetization direction 24M of the second free layer 24 along the perpendicular direction is particularly strengthened. The stack structures [Co/Pt]n, [Co/Pd]n, and [Co/Ni]n respectively mean a structure in which n Co layers and n Pt layers are alternately stacked, a structure in which n Co layers and n Pd layers are alternately stacked, and a structure in which n Co layers and n Ni layers are alternately stacked, and n is, for example, an integer greater than or equal to 2 and less than or equal to 10. In this case, the thickness of each Co layer, each Pt layer, each Pd layer, and each Ni layer can be, for example, greater than or equal to 0.2 nm and less than or equal to 2.0 nm.

Fifth Embodiment

Figure 9:
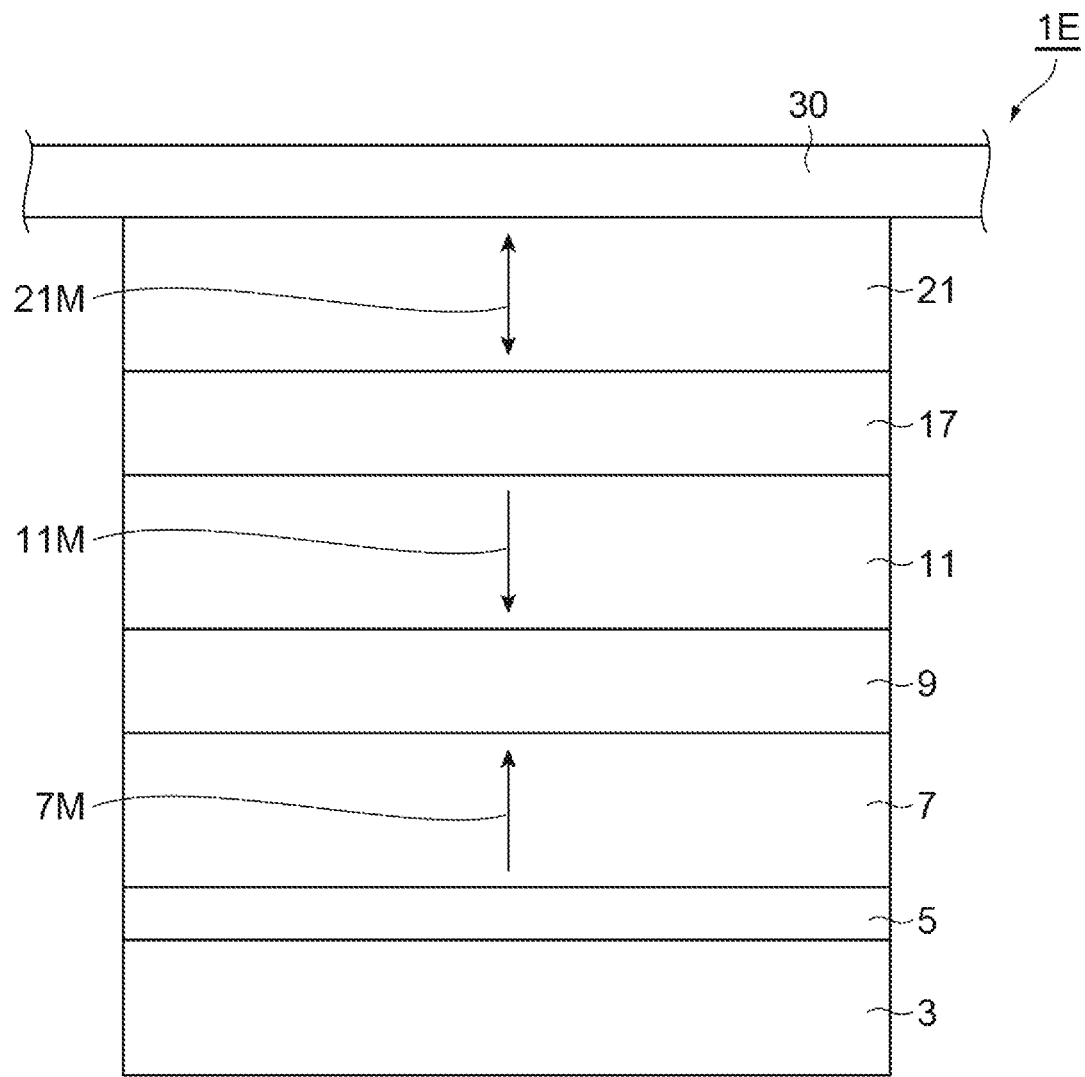
FIG. 9 is a view illustrating a cross-section of a magnetoresistive effect element according to a fifth embodiment.

Next, a magnetoresistive effect element according to a fifth embodiment will be described. FIG. 9 is a view illustrating a cross-section of the magnetoresistive effect element according to the fifth embodiment. A magnetoresistive effect element 1E of the fifth embodiment is different from the magnetoresistive effect element 1A of the first embodiment in that the magnetoresistive effect element 1E further includes a spin orbit torque interconnect layer 30.

The spin orbit torque interconnect layer 30 is an element for causing a current to flow in the in-plane direction of the magnetoresistive effect element 1E, and is formed of a non-magnetic metal such as Pt or Ta, or an antiferromagnetic material. The spin orbit torque interconnect layer 30 is disposed on the magnetization free layer 21. When a current flows through the spin orbit torque interconnect layer 30, a current of spin (spin current) occurs in a direction orthogonal to the current by spin-orbit interaction, and a spin orbit torque is applied to the magnetization of the magnetization free layer 21. Using the spin orbit torque can reverse the magnetization direction 21M of the magnetization free layer 21 at a high speed.

Sixth Embodiment

Figure 10:
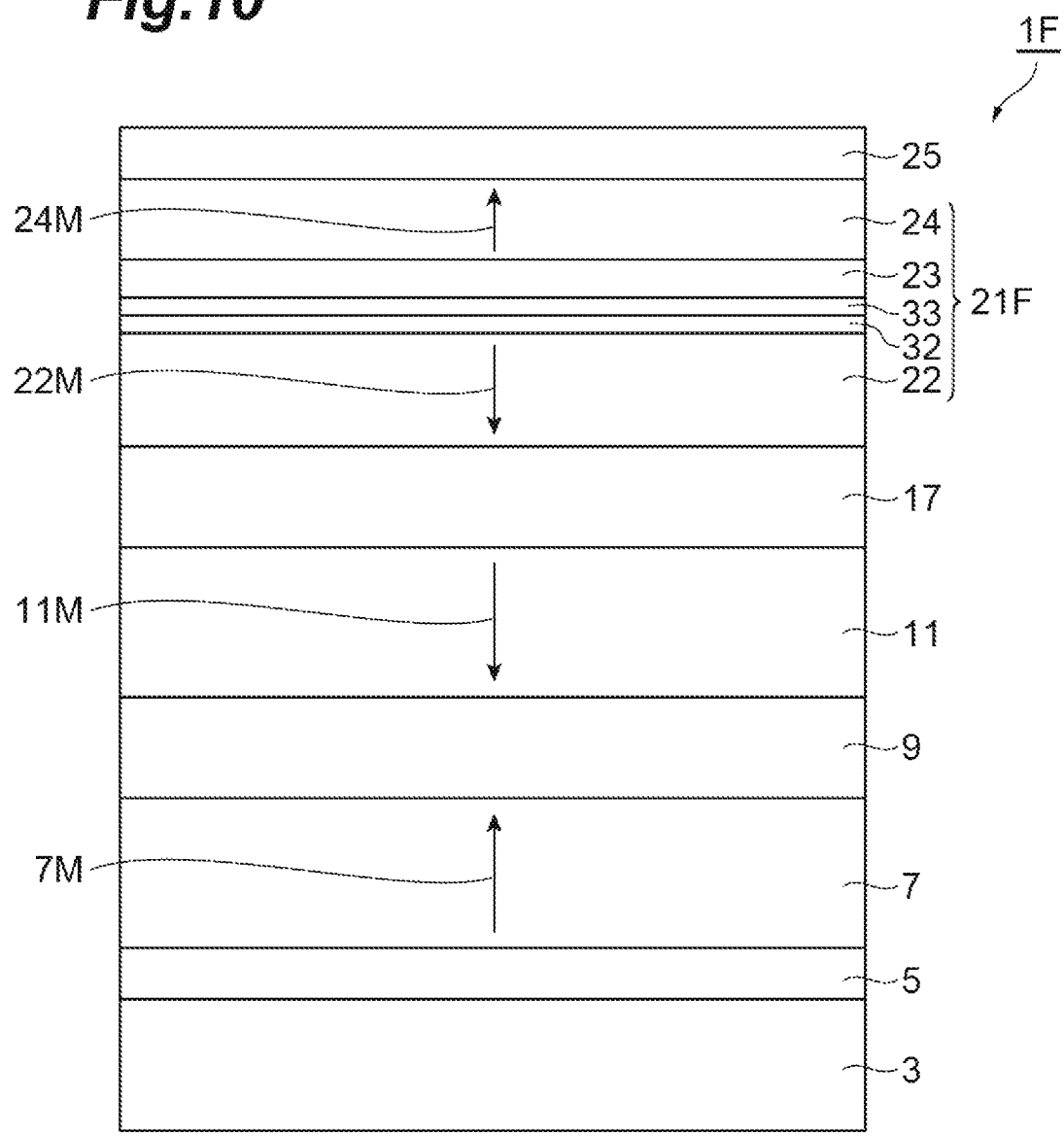
FIG. 10 is a view illustrating a cross-section of a magnetoresistive effect element according to a sixth embodiment.

Next, a magnetoresistive effect element according to a sixth embodiment will be described. FIG. 10 is a view illustrating a cross-section of the magnetoresistive effect element according to the sixth embodiment. A magnetoresistive effect element 1F of the sixth embodiment is different from the magnetoresistive effect element 1D of the fourth embodiment in the configuration of the magnetization free layer. Specifically, a magnetization free layer 21F of the magnetoresistive effect element 1F of the present embodiment further includes a first interposed layer 32 and a second interposed layer 33.

The first interposed layer 32 and the second interposed layer 33 are stacked between the first free layer 22 and the magnetic coupling layer 23. The first interposed layer 32 is in contact with the first free layer 22, and the second interposed layer 33 is in contact with the first interposed layer 32 and the magnetic coupling layer 23. The main element of each of the magnetic coupling layer 23 and the first interposed layer 32 is Ir. The main element of the second interposed layer 33 is an element other than Ir. The thickness of the first interposed layer 32 is greater than or equal to 1.5 times the atomic radius of Ir and less than or equal to 3.2 times the atomic radius of Ir. The thickness of the second interposed layer 33 is less than or equal to 1.5 times the atomic radius of the main element of the second interposed layer 33.

When the thickness of the first interposed layer 32 is less than twice the atomic radius of Ir, the thickness is less than the thickness of one atom of Ir. In this case, the first interposed layer 32 cannot have a continuous shape in an in-film direction and, for example, has a discontinuous shape such as the shape of a plurality of islands in the in-film direction. In addition, in this case, the thickness of the first interposed layer 32 can be evaluated by elemental analysis such as EDS assuming that the first interposed layer 32 has a uniform thickness by calculating the arithmetic mean of the first interposed layer 32 on the whole upper surface of the first free layer 22.

In addition, since the thickness of the second interposed layer 33 is less than or equal to 1.5 times the atomic radius of the main element of the second interposed layer 33, the thickness is less than the thickness of one atom of the main element. In this case, the second interposed layer 33 cannot have a continuous shape in the in-film direction and, for example, has a discontinuous shape such as the shape of a plurality of islands in the in-film direction. In addition, in this case, the thickness of the second interposed layer 33 can be evaluated using the same method as that for the first interposed layer 32.

In the aforementioned magnetoresistive effect element 1F of the present embodiment, the diffusion of the element constituting the first free layer 22 to the magnetic coupling layer 23, and the diffusion of the element constituting the magnetic coupling layer 23 to the first free layer 22 are suppressed by the presence of the second interposed layer 33. When such diffusion occurs, the abruptness of the interface between the first free layer 22 and the magnetic coupling layer 23 is decreased. Thus, in the magnetoresistive effect element 1F of the present embodiment, since the abruptness of the interface between the first free layer 722 and the magnetic coupling layer 23 is maintained, a decrease in exchange coupling magnetic field between the first free layer 22 and the second free layer 24 via the magnetic coupling layer 23 in the SAF structure can be suppressed. In addition, the thicknesses and the arrangement of the first interposed layer 32 and the second interposed layer 33 are determined such that those layers do not substantially affect or sufficiently slightly affect the exchange coupling between the first free layer 22 and the second free layer 24. Thus, since the antiferromagnetic exchange coupling magnetic field between the first free layer 22 and the second free layer 24 can be maintained to be strong, the fixing of the magnetization direction 22M of the first free layer 22 and the magnetization direction 24M of the second free layer 24 along the perpendicular direction is particularly strengthened.

In addition, in the magnetoresistive effect element 1F of the present embodiment, the main element of the second interposed layer 33 is preferably the same as the main element of the first free layer 22. In this case, since the same element as the main element of the first free layer 22 is present in a region between the first free layer 22 and the magnetic coupling layer 23, entropy related to the main element of the first free layer 22 is increased, compared to that when a different element is present in the region. Thus, the main element of the first free layer 22 is difficult to thermodynamically diffuse toward the magnetic coupling layer 23, compared to that when a different element is present in the region. Consequently, the antiferromagnetic exchange coupling magnetic field between the first free layer 22 and the second free layer 24 is further strengthened.

Seventh Embodiment

Figure 11:
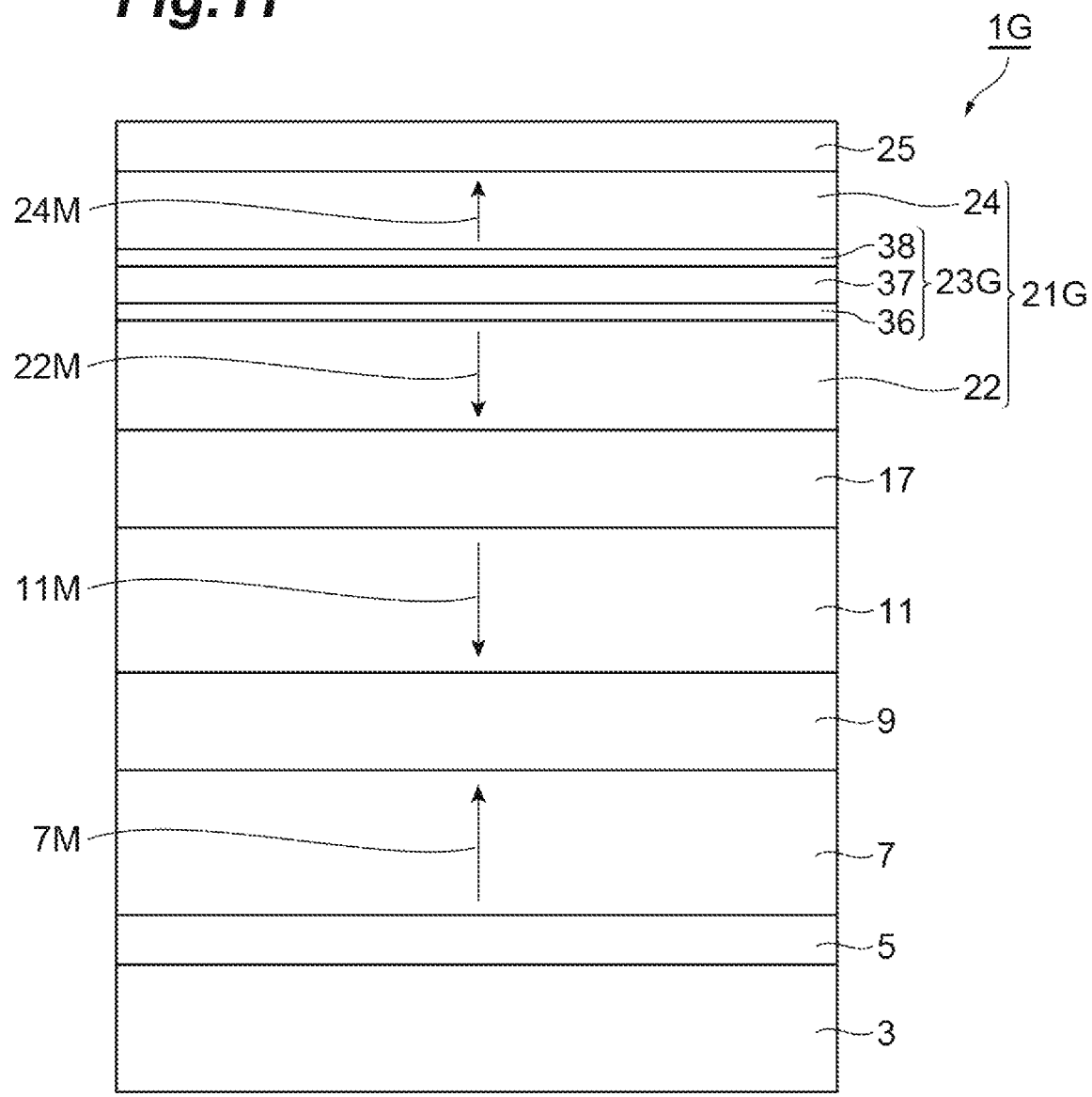
FIG. 11 is a view illustrating a cross-section of a magnetoresistive effect element according to a seventh embodiment.

Next, a magnetoresistive effect element according to a Seventh embodiment will be described. FIG. 11 is a view illustrating a cross-section of the magnetoresistive effect element according to the seventh embodiment. A magnetoresistive effect element 1G of the Seventh embodiment is different from the magnetoresistive effect element 1D of the fourth embodiment in the configuration of the magnetic coupling layer. Specifically, a magnetic coupling layer 23G of the magnetoresistive effect element 1G of the present embodiment includes a first non-magnetic layer 36, a second non-magnetic layer 38, and an intermediate non-magnetic layer 37 that is stacked between the first non-magnetic layer 36 and the second non-magnetic layer 38. The magnetization free layer 21G has the SAF structure and includes the first free layer 22, the magnetic coupling layer 23G and the second free layer 24.

The first non-magnetic layer 36 and the second non-magnetic layer 38 are formed of the same material as the magnetic coupling layer 23 of the fourth embodiment. That is, each of the first non-magnetic layer 36 and the second non-magnetic layer 37 is a non-magnetic layer that is formed of a conductive material and, specifically, includes Ir and at least one of the following five kinds of elements: Cr, Mn, Fe, Co, and Ni. In addition, the intermediate non-magnetic layer 37 is formed of Ir or Ru. The thickness of each of the first non-magnetic layer 36 and the second non-magnetic layer 38 can be, for example, greater than or equal to 0.1 nm and less than or equal to 1.0 nm. The thickness of the intermediate non-magnetic layer 37 can be, for example, greater than or equal to 0.1 nm and less than or equal to 2.0 nm. The thickness of the magnetic coupling layer 23G can be, for example, greater than or equal to 0.1 nm and less than or equal to 1.0 nm.

In the aforementioned magnetoresistive effect element 1G of the present embodiment, the first non-magnetic layer 36 and the second non-magnetic layer 38 are formed of the same material as the magnetic coupling layer 23 of the fourth embodiment, and are in contact with the first free layer 22 and the second free layer 24, respectively. Thus, based on the same principle as the case of the magnetoresistive effect element 1D of the fourth embodiment, the value of the uniaxial anisotropy energy Ku in the perpendicular direction of the first free layer 22 and the second free layer 24 can be increased to the positive side. Furthermore, since the intermediate non-magnetic layer 37 that is formed of Ir or Ru and does not substantially include other elements is included in the magnetic coupling layer 23G between the first non-magnetic layer 36 and the second non-magnetic layer 38, the exchange coupling magnetic field in the SAF structure can be particularly strengthened. Consequently, the fixing of the magnetization direction 22M of the first free layer 22 and the magnetization direction 24M of the second free layer 24 along the perpendicular direction is particularly strengthened.

(Magnetic Memory)

Figure 12:
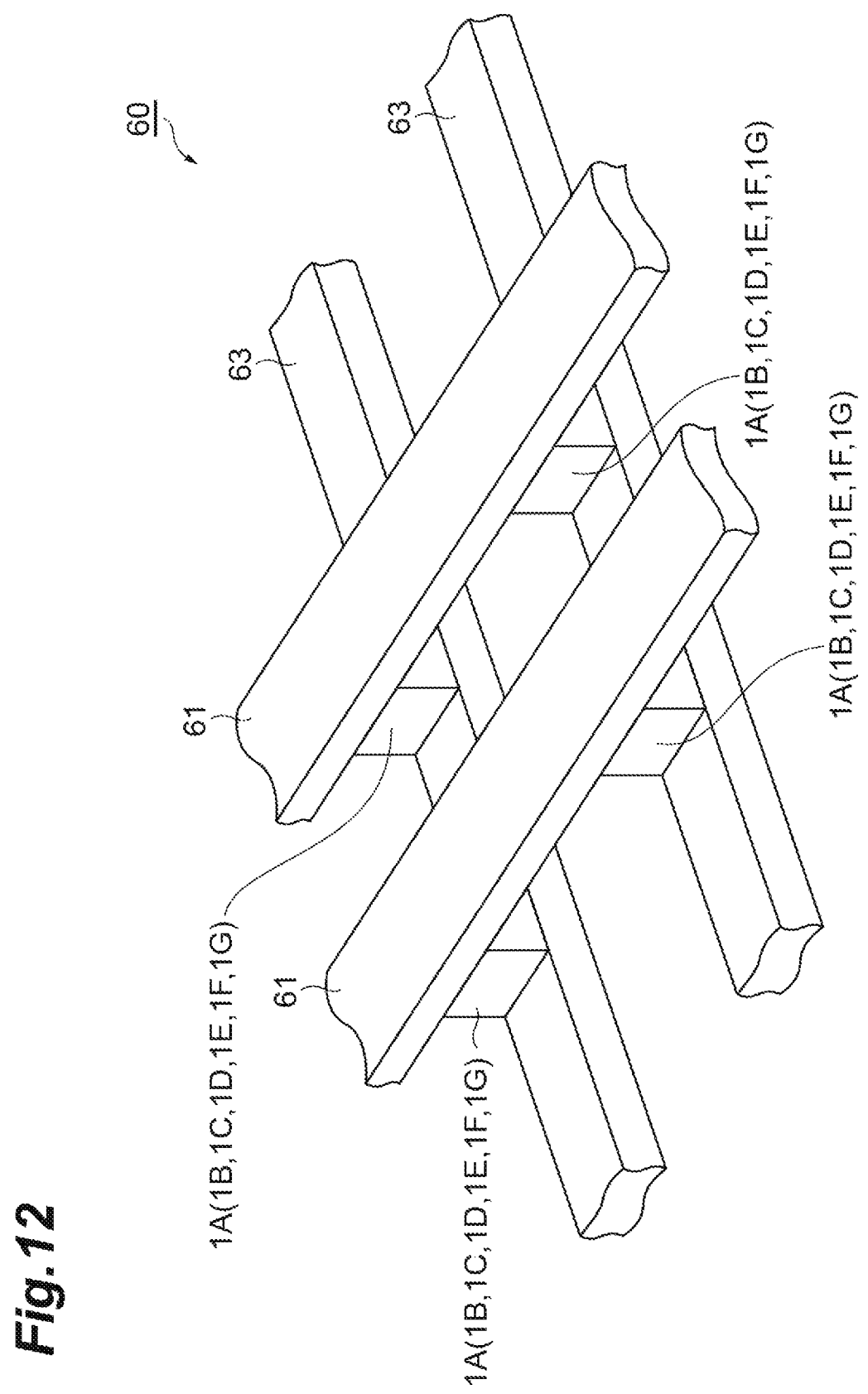
FIG. 12 is a schematic perspective view of a magnetic memory.
Figure 13:
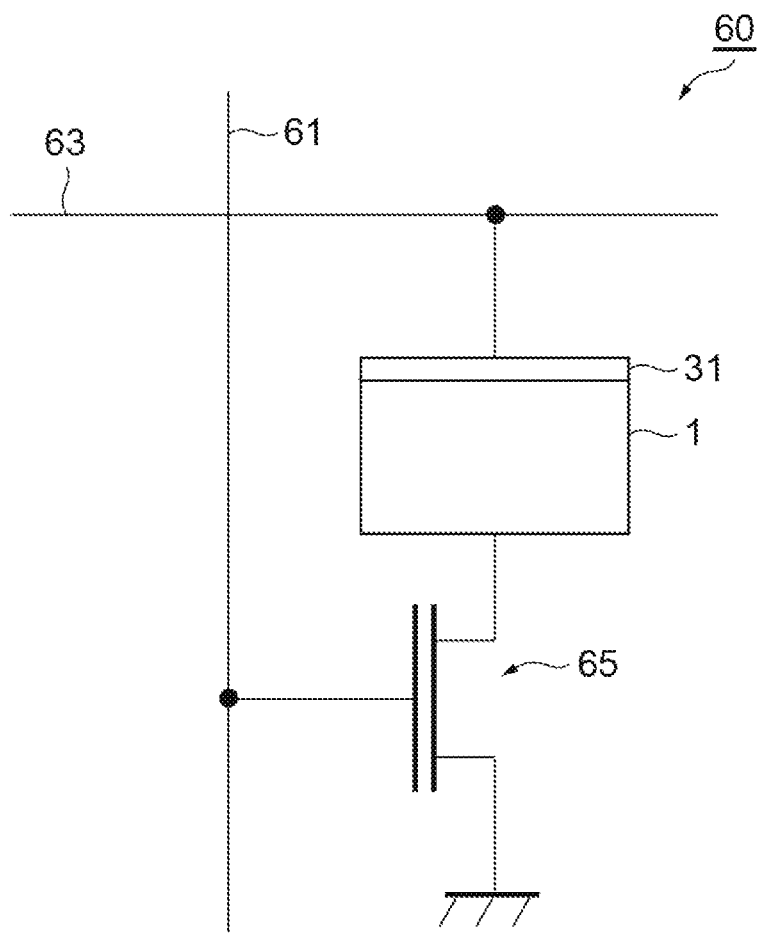
FIG. 13 is a view illustrating an electrical connection configuration of one memory cell of the magnetic memory.

Next, a magnetic memory in which the above magnetoresistive effect element is used will be described. FIG. 12 is a schematic perspective view of the magnetic memory according to the present embodiment. FIG. 13 is a view illustrating an electrical connection configuration of one memory cell of the magnetic memory according to the present embodiment. A magnetic memory 60 according to the present embodiment has a configuration in which a plurality of magnetoresistive effect elements are arranged in a grid shape at intersections between a plurality of word lines 61 and a plurality of bit lines 63 that are wired in a grid shape in a plan view. Each magnetoresistive effect element is any of the magnetoresistive effect elements 1A, 1B, 1C, 1D, 1E, 1F, and 1G of the first to seventh embodiments, and functions as a storage element of the magnetic memory 60. Accordingly, a plurality of memory cells are arranged in a grid shape. The magnetization directions 21M, 22M, and 24M of the magnetization free layers 21, 21D, 21F and 21G as storage layers are set in accordance with storage data.

The upper end of the magnetoresistive effect element 1A (1B, 1C, 1D, 1E, 1F, or 1G) is connected to the bit line 63 via the upper electrode 31, and the lower end of the magnetoresistive effect element 1A (1B, 1C, 1D, 1E, 1F, or 1G)) is connected to the drain of a selection transistor 65. The word line 61 is connected to the gate of the transistor 65, and the source of the transistor 65 is connected to the ground.

When data is written into each memory cell, the transistor 65 is switched ON by applying a selection voltage to the corresponding word line 61, and a voltage is applied such that a current of different polarity flows between the bit line 63 and the ground in accordance with the write data (H or L). Accordingly, the magnetization directions of the magnetization free layers 21, 21D, 21F and 21G are set in accordance with the write data, and the magnetoresistive effect element 1 has a resistance value that corresponds to the written data. When data is read from each memory cell, the transistor 65 is switched ON by applying a selection voltage (H) to the corresponding word line 61, and a low voltage that does not change the magnetization directions of the magnetization free layers 21, 21D, 21F and 21G is applied between the bit line 63 and the ground. Accordingly, while a current flows between the bit line 63 and the ground via the transistor 65 and the magnetoresistive effect element 1A (1B, 1C, 1D, 1E, 1F, or 1G), the magnitude of the value of the current corresponds to the resistance value of the magnetoresistive effect element 1A (1B, 1C, 1D, 1E, 1F, or 1G). Thus, the data stored in the memory cell can be detected.

REFERENCE SIGNS LIST

1A MAGNETORESISTIVE EFFECT ELEMENT
7 FIRST FIXED LAYER
9 MAGNETIC COUPLING LAYER

11 SECOND FIXED LAYER
15 MAGNETIZATION FIXED LAYER
17 NON-MAGNETIC SPACER LAYER
21 MAGNETIZATION FREE LAYER

The invention claimed is:

1. A magnetoresistive effect element comprising:
a magnetization fixed layer;
a magnetization free layer; and
a non-magnetic spacer layer stacked between the magnetization fixed layer and the magnetization free layer,
wherein the magnetization free layer includes a first free layer and a second free layer formed of a ferromagnetic material, and a magnetic coupling layer stacked between the first free layer and the second free layer,
the first free layer and the second free layer are magnetically coupled to each other by exchange coupling via the magnetic coupling layer such that magnetization directions of the first free layer and the second free layer are antiparallel to each other, and
the magnetic coupling layer is a non-magnetic layer that includes Ir and at least one of the following elements: Fe, Co, and Ni.

2. The magnetoresistive effect element according to claim 1,
wherein an absolute value of a lattice mismatch ratio between the magnetic coupling layer and the first free layer or the second free layer is less than or equal to 7%.

3. The magnetoresistive effect element according to claim 1,
wherein the magnetic coupling layer has an fcc structure or an hcp structure, and
each of the first free layer and the second free layer includes Co, Ni, or an alloy thereof, and has the fcc structure or the hcp structure.

4. A magnetoresistive effect element comprising:
a magnetization fixed layer;
a magnetization free layer; and
a non-magnetic spacer layer stacked between the magnetization fixed layer and the magnetization free layer,
wherein the magnetization free layer includes a first free layer and a second free layer formed of a ferromagnetic material, and a magnetic coupling layer stacked between the first free layer and the second free layer,
the first free layer and the second free layer are magnetically coupled to each other by exchange coupling via the magnetic coupling layer such that magnetization directions of the first free layer and the second free layer are antiparallel to each other, and
the magnetic coupling layer is a non-magnetic layer that includes Ir and at least one of the following elements: Cr, Mn, Fe, Co, and Ni,
the magnetization free layer further includes a first interposed layer and a second interposed layer stacked between the first free layer and the magnetic coupling layer,
the first interposed layer is in contact with the first free layer, and the second interposed layer is in contact with the first interposed layer and the magnetic coupling layer,
a main element of the magnetic coupling layer and the first interposed layer is Ir,
a main element of the second interposed layer is an element other than Ir,
a thickness of the first interposed layer is greater than or equal to 1.5 times and less than or equal to 3.2 times an atomic radius of Ir, and
a thickness of the second interposed layer is less than or equal to 1.5 times an atomic radius of the main element of the second interposed layer.

5. The magnetoresistive effect element according to claim 1,
wherein a thickness of the magnetic coupling layer is less than or equal to 1 nm.

6. A magnetoresistive effect element comprising:
a magnetization fixed layer;
a magnetization free layer; and
a non-magnetic spacer layer stacked between the magnetization fixed layer and the magnetization free layer,
wherein the magnetization free layer includes a first free layer and a second free layer formed of a ferromagnetic material, and a magnetic coupling layer stacked between the first free layer and the second free layer,
the first free layer and the second free layer are magnetically coupled to each other by exchange coupling via the magnetic coupling layer such that magnetization directions of the first free layer and the second free layer are antiparallel to each other, and
the magnetic coupling layer is a non-magnetic layer that includes Ir and at least one of the following elements: Cr, Mn, Fe, Co, and Ni,
the magnetic coupling layer includes a first non-magnetic layer and a second non-magnetic layer that include Ir and at least one of the following elements: Cr, Mn, Fe, Co, and Ni, and an intermediate non-magnetic layer formed of Ir or Ru and stacked between the first non-magnetic layer and the second non-magnetic layer.

7. The magnetoresistive effect element according to claim 1,
wherein at least one of the first free layer and the second free layer has a stack structure represented by [Co/Pt]n, [Co/Pd]n, or [Co/Ni]n.

8. The magnetoresistive effect element according to claim 1, further comprising:
a spin orbit torque interconnect layer disposed such that a spin orbit torque is applied to the magnetization free layer.

9. A magnetic memory comprising:
the magnetoresistive effect element according to claim 1 as a storage element.

10. The magnetoresistive effect element according to claim 2,
wherein the magnetic coupling layer has an fcc structure or an hcp structure, and
each of the first free layer and the second free layer includes Co, Ni, or an alloy thereof, and has the fcc structure or the hcp structure.

11. A magnetoresistive effect element comprising:
a magnetization fixed layer;
a magnetization free layer; and
a non-magnetic spacer layer stacked between the magnetization fixed layer and the magnetization free layer,
wherein the magnetization free layer includes a first free layer and a second free layer formed of a ferromagnetic material, and a magnetic coupling layer stacked between the first free layer and the second free layer,
the first free layer and the second free layer are magnetically coupled to each other by exchange coupling via the magnetic coupling layer such that magnetization directions of the first free layer and the second free layer are antiparallel to each other, and
the magnetic coupling layer is a non-magnetic layer that includes Ir and at least one of the following elements: Cr, Mn, Fe, Co, and Ni, an absolute value of a lattice mismatch ratio between the magnetic coupling layer and the first free layer or the second free layer is less than or equal to 7%, the magnetization free layer further includes a first interposed layer and a second interposed layer stacked between the first free layer and the magnetic coupling layer, the first interposed layer is in contact with the first free layer, and the second interposed layer is in contact with the first interposed layer and the magnetic coupling layer, a main element of the magnetic coupling layer and the first interposed layer is Ir, a main element of the second interposed layer is an element other than Ir, a thickness of the first interposed layer is greater than or equal to 1.5 times and less than or equal to 3.2 times an atomic radius of Ir, and a thickness of the second interposed layer is less than or equal to 1.5 times an atomic radius of the main element of the second interposed layer.

12. A magnetoresistive effect element comprising:
a magnetization fixed layer;
a magnetization free layer; and
a non-magnetic spacer layer stacked between the magnetization fixed layer and the magnetization free layer, wherein the magnetization free layer includes a first free layer and a second free layer formed of a ferromagnetic material, and a magnetic coupling layer stacked between the first free layer and the second free layer, the first free layer and the second free layer are magnetically coupled to each other by exchange coupling via the magnetic coupling layer such that magnetization directions of the first free layer and the second free layer are antiparallel to each other, and the magnetic coupling layer is a non-magnetic layer that includes Ir and at least one of the following elements: Cr, Mn, Fe, Co, and Ni, the magnetic coupling layer has an fcc structure or an hcp structure, each of the first free layer and the second free layer includes Co, Ni, or an alloy thereof, and has the fcc structure or the hcp structure, the magnetization free layer further includes a first interposed layer and a second interposed layer stacked between the first free layer and the magnetic coupling layer, the first interposed layer is in contact with the first free layer, and the second interposed layer is in contact with the first interposed layer and the magnetic coupling layer, a main element of the magnetic coupling layer and the first interposed layer is Ir, a main element of the second interposed layer is an element other than Ir, a thickness of the first interposed layer is greater than or equal to 1.5 times and less than or equal to 3.2 times an atomic radius of Ir, and a thickness of the second interposed layer is less than or equal to 1.5 times an atomic radius of the main element of the second interposed layer.

13. A magnetoresistive effect element comprising:
a magnetization fixed layer;
a magnetization free layer; and
a non-magnetic spacer layer stacked between the magnetization fixed layer and the magnetization free layer, wherein the magnetization free layer includes a first free layer and a second free layer formed of a ferromagnetic material, and a magnetic coupling layer stacked between the first free layer and the second free layer, the first free layer and the second free layer are magnetically coupled to each other by exchange coupling via the magnetic coupling layer such that magnetization directions of the first free layer and the second free layer are antiparallel to each other, and the magnetic coupling layer is a non-magnetic layer that includes Ir and at least one of the following elements: Cr, Mn, Fe, Co, and Ni, an absolute value of a lattice mismatch ratio between the magnetic coupling layer and the first free layer or the second free layer is less than or equal to 7%, the magnetic coupling layer has an fcc structure or an hcp structure, each of the first free layer and the second free layer includes Co, Ni, or an alloy thereof, and has the fcc structure or the hcp structure, wherein the magnetization free layer further includes a first interposed layer and a second interposed layer stacked between the first free layer and the magnetic coupling layer, the first interposed layer is in contact with the first free layer, and the second interposed layer is in contact with the first interposed layer and the magnetic coupling layer, a main element of the magnetic coupling layer and the first interposed layer is Ir, a main element of the second interposed layer is an element other than Ir, a thickness of the first interposed layer is greater than or equal to 1.5 times and less than or equal to 3.2 times an atomic radius of Ir, and a thickness of the second interposed layer is less than or equal to 1.5 times an atomic radius of the main element of the second interposed layer.

14. A magnetoresistive effect element comprising:
a magnetization fixed layer;
a magnetization free layer; and
a non-magnetic spacer layer stacked between the magnetization fixed layer and the magnetization free layer, wherein the magnetization free layer includes a first free layer and a second free layer formed of a ferromagnetic material, and a magnetic coupling layer stacked between the first free layer and the second free layer, the first free layer and the second free layer are magnetically coupled to each other by exchange coupling via the magnetic coupling layer such that magnetization directions of the first free layer and the second free layer are antiparallel to each other, and the magnetic coupling layer is a non-magnetic layer that includes Ir and at least one of the following elements: Cr, Mn, Fe, Co, and Ni, an absolute value of a lattice mismatch ratio between the magnetic coupling layer and the first free layer or the second free layer is less than or equal to 7%, the magnetic coupling layer includes a first non-magnetic layer and a second non-magnetic layer that include Ir and at least one of the following elements: Cr, Mn, Fe, Co, and Ni, and an intermediate non-magnetic layer formed of Ir or Ru and stacked between the first non-magnetic layer and the second non-magnetic layer.

15. A magnetoresistive effect element comprising:
a magnetization fixed layer;
a magnetization free layer; and a non-magnetic spacer layer stacked between the magnetization fixed layer and the magnetization free layer, wherein the magnetization free layer includes a first free layer and a second free layer formed of a ferromagnetic material, and a magnetic coupling layer stacked between the first free layer and the second free layer, the first free layer and the second free layer are magnetically coupled to each other by exchange coupling via the magnetic coupling layer such that magnetization directions of the first free layer and the second free layer are antiparallel to each other, and the magnetic coupling layer is a non-magnetic layer that includes Ir and at least one of the following elements: Cr, Mn, Fe, Co, and Ni, the magnetic coupling layer has an fcc structure or an hcp structure, each of the first free layer and the second free layer includes Co, Ni, or an alloy thereof, and has the fcc structure or the hcp structure, the magnetic coupling layer includes a first non-magnetic layer and a second non-magnetic layer that include Ir and at least one of the following elements: Cr, Mn, Fe, Co, and Ni, and an intermediate non-magnetic layer formed of Ir or Ru and stacked between the first non-magnetic layer and the second non-magnetic layer.

16. A magnetoresistive effect element comprising:
a magnetization fixed layer;
a magnetization free layer; and
a non-magnetic spacer layer stacked between the magnetization fixed layer and the magnetization free layer, wherein the magnetization free layer includes a first free layer and a second free layer formed of a ferromagnetic material, and a magnetic coupling layer stacked between the first free layer and the second free layer, the first free layer and the second free layer are magnetically coupled to each other by exchange coupling via the magnetic coupling layer such that magnetization directions of the first free layer and the second free layer are antiparallel to each other, and the magnetic coupling layer is a non-magnetic layer that includes Ir and at least one of the following elements: Cr, Mn, Fe, Co, and Ni, an absolute value of a lattice mismatch ratio between the magnetic coupling layer and the first free layer or the second free layer is less than or equal to 7%, the magnetic coupling layer has an fcc structure or an hcp structure, each of the first free layer and the second free layer includes Co, Ni, or an alloy thereof, and has the fcc structure or the hcp structure, the magnetic coupling layer includes a first non-magnetic layer and a second non-magnetic layer that include Ir and at least one of the following elements: Cr, Mn, Fe, Co, and Ni, and an intermediate non-magnetic layer formed of Ir or Ru and stacked between the first non-magnetic layer and the second non-magnetic layer.

17. The magnetoresistive effect element according to claim 4, wherein the magnetic coupling layer includes a first non-magnetic layer and a second non-magnetic layer that include Ir and at least one of the following elements: Cr, Mn, Fe, Co, and Ni, and an intermediate non-magnetic layer formed of Ir or Ru and stacked between the first non-magnetic layer and the second non-magnetic layer.

18. The magnetoresistive effect element according to claim 11, wherein the magnetic coupling layer includes a first non-magnetic layer and a second non-magnetic layer that include Ir and at least one of the following elements: Cr, Mn, Fe, Co, and Ni, and an intermediate non-magnetic layer formed of Ir or Ru and stacked between the first non-magnetic layer and the second non-magnetic layer.

19. The magnetoresistive effect element according to claim 12, wherein the magnetic coupling layer includes a first non-magnetic layer and a second non-magnetic layer that include Ir and at least one of the following elements: Cr, Mn, Fe, Co, and Ni, and an intermediate non-magnetic layer formed of Ir or Ru and stacked between the first non-magnetic layer and the second non-magnetic layer.

\* \* \* \* \*